United States Patent [19]

Ohba et al.

[11] Patent Number: 5,076,860
[45] Date of Patent: Dec. 31, 1991

[54] ALGAN COMPOUND SEMICONDUCTOR MATERIAL

[75] Inventors: Yasuo Ohba, Yokohama; Toshihide Izumiya; Ako Hatano, both of Tokyo, all of Japan

[73] Assignee: Kabushiki Kaisha Toshiba, Kawasaki, Japan

[21] Appl. No.: 414,520

[22] Filed: Sep. 29, 1989

[30] Foreign Application Priority Data

Jan. 13, 1989 [JP] Japan ................................ 1-6222
Apr. 28, 1989 [JP] Japan ................................ 1-110501

[51] Int. Cl.$^5$ ..................... H01L 21/205; C01B 21/06
[52] U.S. Cl. ......................... 148/33.1; 148/DIG. 65; 148/DIG. 113; 148/33.4; 148/33.5; 437/110; 437/129
[58] Field of Search ............... 148/DIG. 65, 72, 95, 148/110, 113, 119, 169, 33, 33.1, 33.4, 33.5, 33.6; 156/610-614; 357/16, 17; 437/81, 107, 108, 110, 126, 129, 133, 976

[56] References Cited

U.S. PATENT DOCUMENTS

| 3,925,121 | 12/1975 | Touchy ............................ 357/30 |
| 4,213,781 | 7/1980 | Noreika et al. ................. 437/133 |
| 4,365,107 | 12/1982 | Yamauchi ........................ 357/2 |
| 4,697,202 | 9/1987 | Sher ............................... 437/165 |
| 4,879,487 | 11/1989 | Sugai et al. ..................... 333/193 |

FOREIGN PATENT DOCUMENTS 0297654 1/1989 European Pat. Off. .
0145199 11/1981 Japan .
0243144 10/1987 Japan .

OTHER PUBLICATIONS

M. Mizuta et al., "Low Temperature Growth of GaN and AlN on GaAs Utilizing Metalorganics and Hydrazine", Japanese Journal of Applied Physics, vol. 25, No. 12, Dec. 1986, pp. L945-L948.

W. Seifert and A. Tempel, "Cubic Phase Gallium Nitride by Chemical Vapour Deposition", Phys. Stat. Sol. (a) 23 (1974)—K39-K40.

"Epitaxial Growth of Undoped and Mg-Doped GaN", vol. 15, No. 10, Japanese Journal of Applied Physics, Oct. 1976, pp. 1943-1950, Masatoshi Sano et al.

Primary Examiner—Olik Chaudhuri
Assistant Examiner—William Bunch
Attorney, Agent, or Firm—Oblon, Spivak, McClelland, Maier & Neustadt

[57] ABSTRACT

A compound semiconductor material includes $Ga_xAl_{1-x}N$ (wherein $0 \leq x \leq 1$) containing B and P and having a zinc blend type crystal structure. A compound semiconductor element includes $Ga_xAl_{1-x}N$ (wherein $0 \leq x \leq 1$) layer having a zinc blend type crystal structure. A method of manufacturing a compound semiconductor element includes the step of sequentially forming a BP layer and a $Ga_xAl_{1-x}N$ (wherein $0 \leq x \leq 1$) layer on a substrate so as to form a heterojunction by using a metal organic chemical vapor deposition apparatus having a plurality of reaction regions, and moving the substrate between the plurality of reaction regions.

12 Claims, 19 Drawing Sheets

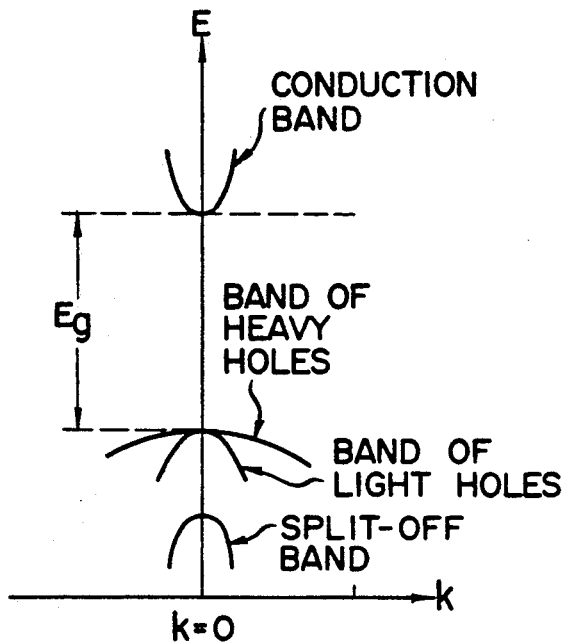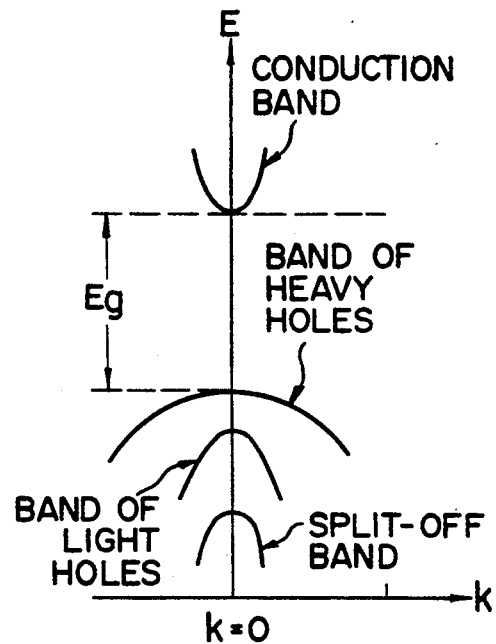
FIG. 1A    FIG. 1B
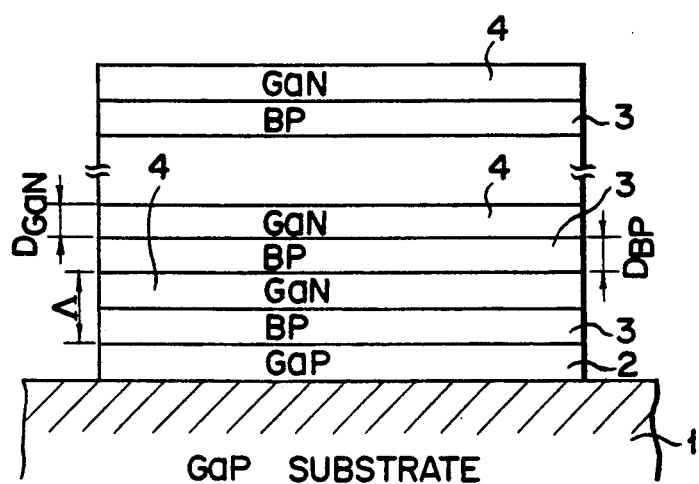
FIG. 2

AlN CONTENT IN NITRIDE LAYER

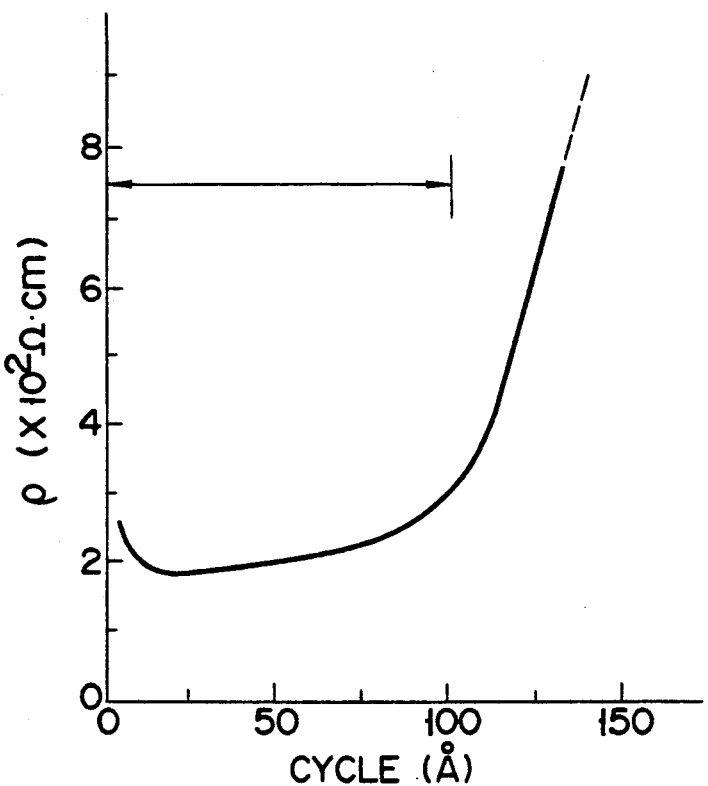
F I G. 12
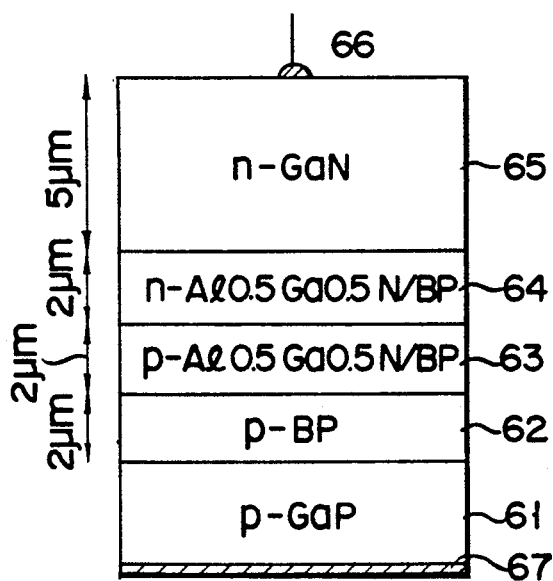
F I G. 13

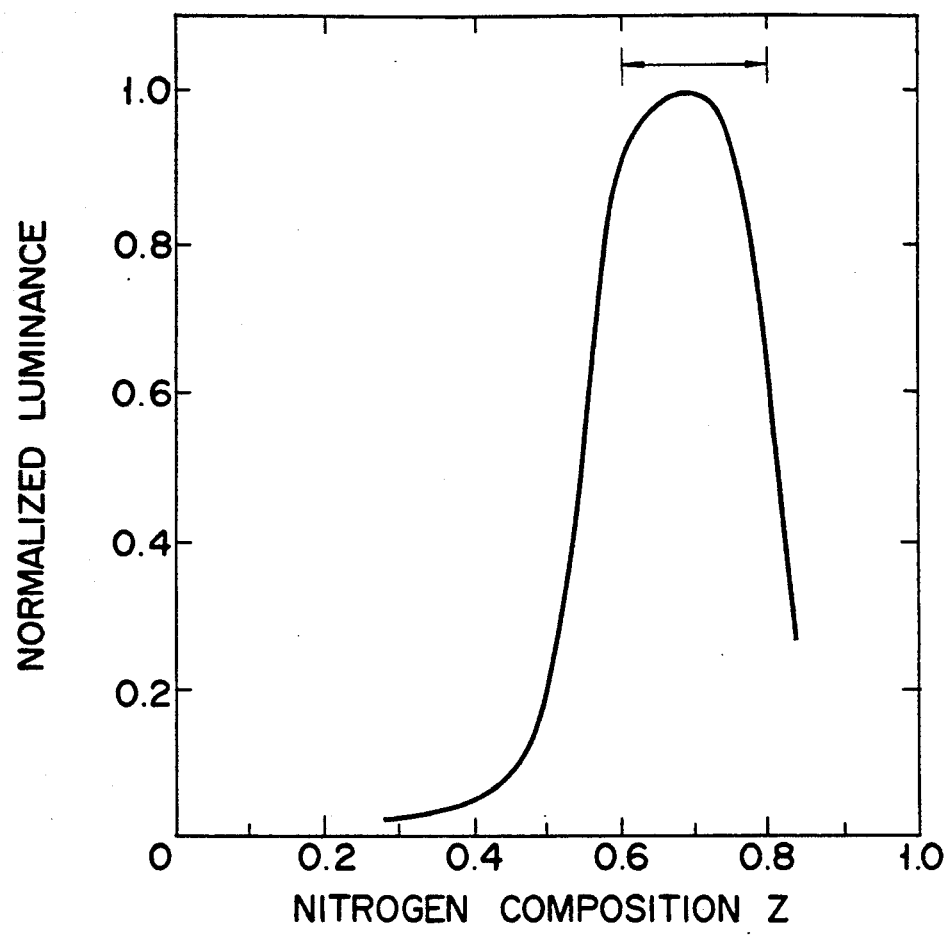
F I G. 14
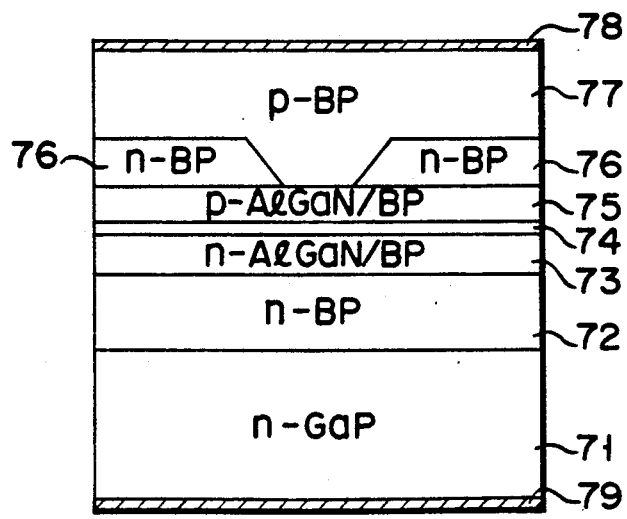
F I G. 15

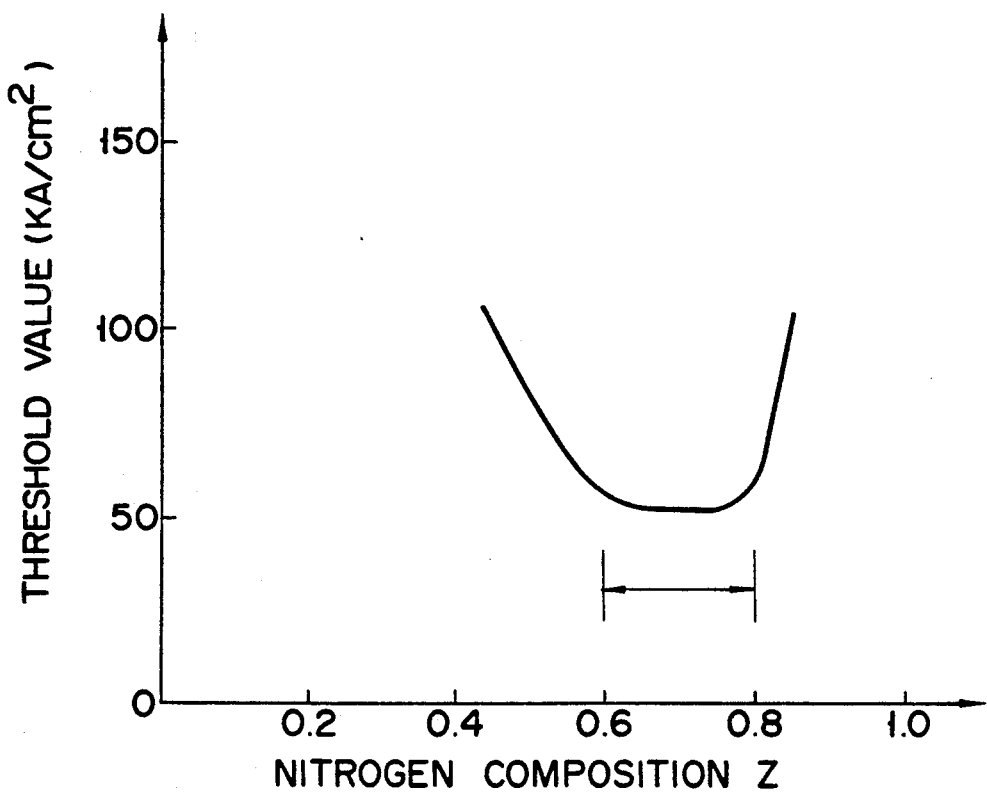
F I G. 16
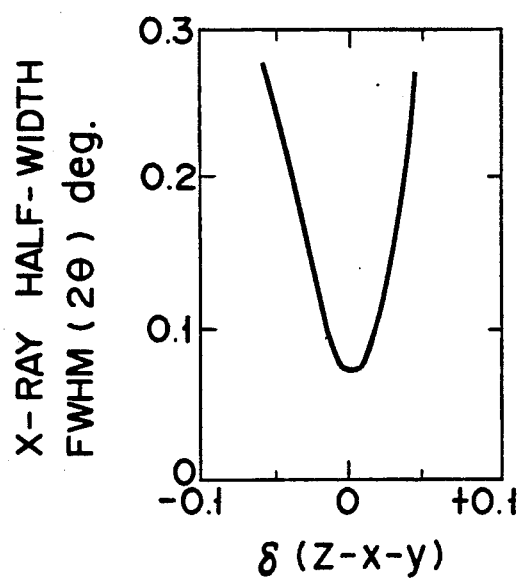
F I G. 17

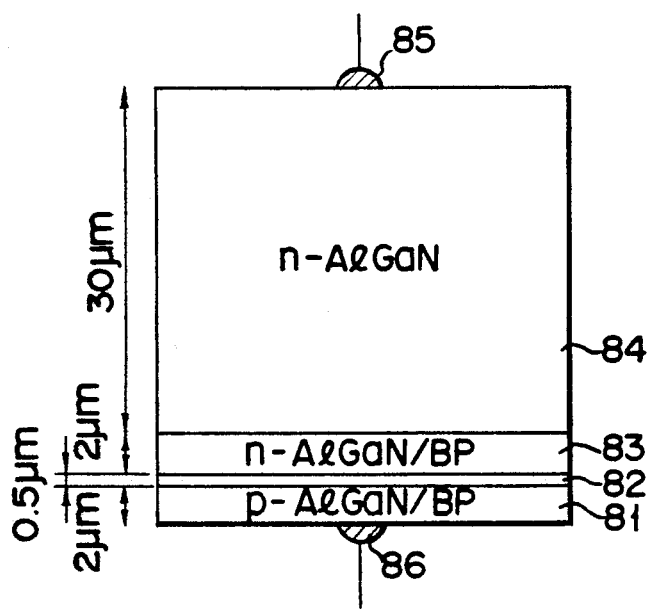
F I G. 18
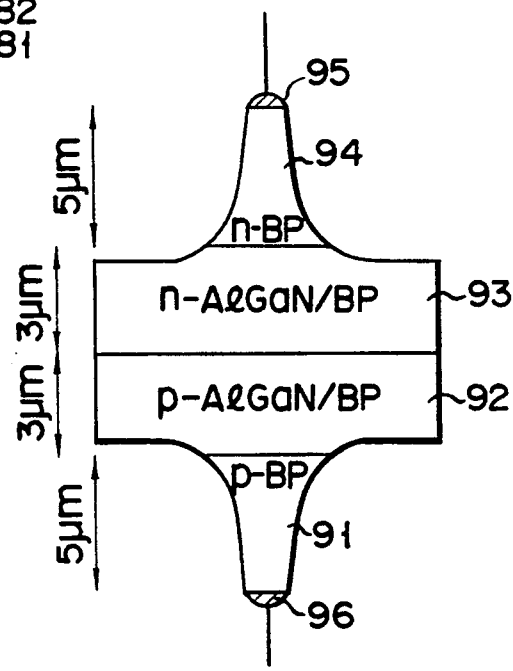
F I G. 19
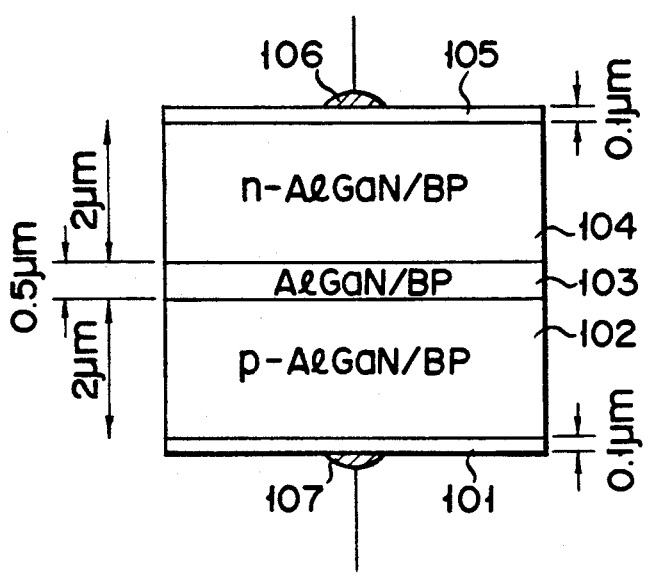
F I G. 20

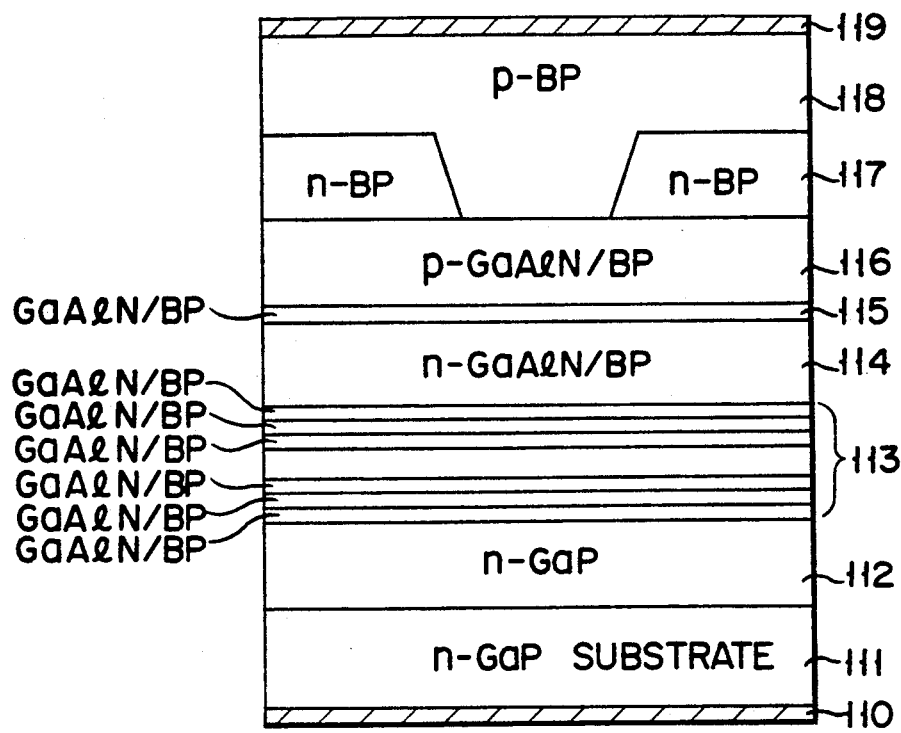
F I G. 21
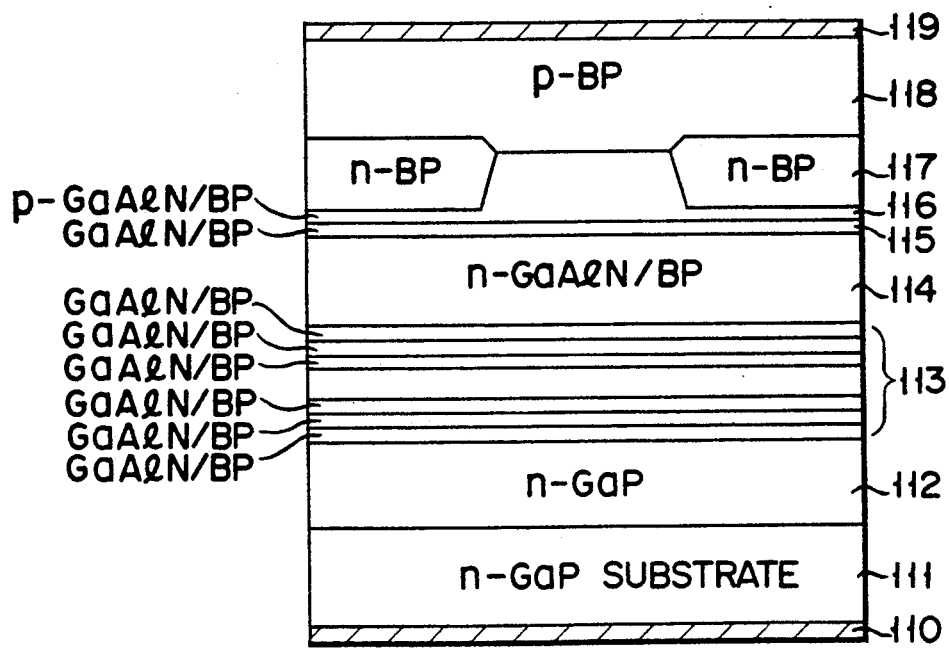
F I G. 22

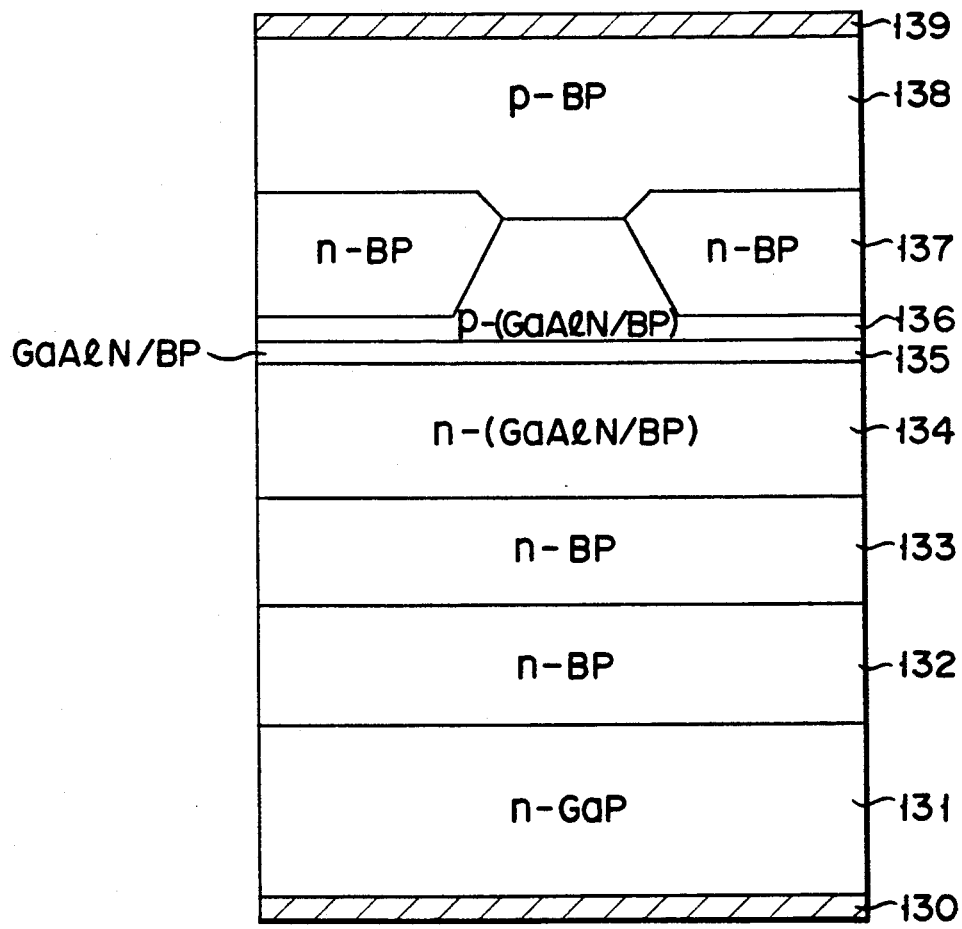
F I G. 29

ALGAN COMPOUND SEMICONDUCTOR MATERIAL

BACKGROUND OF THE INVENTION

1. Field of the Invention

The present invention relates to a compound semiconductor material having a large band gap which can be effectively used for a short wavelength light-emitting element, a semiconductor element using the same, and a method of manufacturing the semiconductor element.

2. Description of the Related Art

With an increase in speed and recording density of a data processing system, demands have arisen for short wavelength semiconductor lasers. As conventional materials for semiconductor lasers, Group III-V semiconductor materials such as AlGaAs, InGaAsP, and AlInP have been used. However, all these materials have band gaps whose values are far from satisfying the requirements of green emission. Green emission cannot be realized by using existing materials, and hence material design based on a new concept is required.

When Group III-V compound semiconductor materials are considered in view of large band gaps, nitrides and phosphides of light Group III elements have large band gaps, e.g., BN (4 or 8 eV), AlN (6 eV), GaN (3.4 eV), InP (2.4 eV), AlP (2.4 eV), and GaP (2.3 and 2.8 eV). Of these materials, BN has a large band gap, but a high-pressure phase (c-BN) of BN having a 4-coordinate (sp3) bond is difficult to synthesize. In addition, there are three types of BN, and mixtures of BN and other elements are easily formed. For these reasons, BN cannot be used in practice. Moreover, impurity doping in BN is difficult. InN has a relatively small band gap and poor thermal stability. Generally, only polycrystals can be obtained from InN. The band gaps of both AlP and GaP are slightly insufficient. Other compounds, i.e., AlN and GaN have large band gaps and are excellent in stability. Therefore, AlN and GaN are suitable for short wavelength light-emitting elements. However, AlN and GaN have Worzeite type (to be referred as a WZ type) crystal structures. In addition, since GaN has a strong ionization tendency, lattice defects tend to occur. Therefore, a p-type semiconductor having a low resistance cannot be obtained from GaN.

In order to solve these problems, attempts have been made to obtain materials whose band gaps are increased by mixing B and N with Group III-V compounds containing no B and N which have been developed as conventional materials for semiconductor lasers. However, there are large differences in lattice constant between the conventional materials and materials containing B and N, ranging from 20 to 40%. In addition, they have different lattice configurations. For these reasons, stable crystals have not been obtained yet by mixing B and N with III-V compounds containing no B and N. For example, if N is mixed with GaP, the content of N cannot exceed 1% with respect to GaP. Hence, a sufficiently large band gap cannot be obtained.

According to the studies of the present inventors, the essential reasons why a p-type crystal having a low resistance cannot be obtained by using GaN or AlN are that defects tend to occur due to the strong ionization tendency and that these compounds have WZ structures instead of Zinc Blend type (to be referred to as a ZB type hereinafter) structures. Such a situation will be described below with reference to FIGS. 1A and 1B.

FIG. 1A shows a band structure of a cubic semiconductor. In this case, the Γ point is set at the bottom of a conduction band for convenience. However, even if it is set at another position, there will be no substantial difference in discussion. Degeneracy of bands of heavy and light holes occurs near the apex of a valence band of interest. In addition, an orbit which is shifted to the low energy side due to spin-orbit interaction is present in the valence band. In this case, since holes are present both in the heavy and light bands, the average mass of the holes in the two bands is regarded as an effective mass. The WZ structure of a hexagonal crystal, however, is greatly influenced by a crystalline field due to its strong uniaxial isotropy. As shown in FIG. 1B, therefore, degeneracy of the bands of heavy and light holes is released and the band of heavy holes is shifted to the high energy side. As a result, the holes are present in the band of heavy holes. Since an acceptor energy level becomes deep with an increase in effective mass of the holes, holes tend not to be emitted. For this reason, low-resistance p-type semiconductors cannot be formed.

As described above, no conventional semiconductor material can satisfy the conditions required for realizing a green emission semiconductor laser or a high-luminance blue LED, i.e., having a sufficiently large band gap, e.g., 2.7 eV, allowing easy p-n junction control, and being excellent in crystal quality. Although AlN and GaN are nitrides which are effective in obtaining large band gaps, low-resistance p-type layers cannot be obtained.

SUMMARY OF THE INVENTION

It is an object of the present invention to provide a compound semiconductor material which has a large band gap, allows easy p-n junction control, and enables formation of a stable crystal.

It is another object of the present invention to provide a semiconductor element constituted by using the above compound semiconductor material and a method of manufacturing the semiconductor element.

According to the studies of the present inventors, even a crystal essentially having a WZ structure which is grown on a crystal having a stable ZB structure can maintain a ZB structure to a certain thickness.

According to a first aspect of the present invention, therefore, a $Ga_xAl_{1-x}N$ ($0 \leq x \leq 1$) layer is stacked on a BP layer having substantially the same bond length as that thereof, a ZB structure, and a small ionization tendency, and allowing easy p-n junction control so as to form a heterojunction, thereby providing a compound semiconductor material of a ZB structure which has both a large band gap property of a direct transition type nitride and the characteristics of BP, i.e., having a small ionization tendency and free from defects.

In addition, according to the studies of the present inventors, a stable mixed crystal can be sometimes obtained even from combinations of Group III elements such as B and Ga, Al, or In, or from Group III-V compound semiconductor materials including combinations of N and P or As, which have been considered as materials allowing no stable mixed crystal, by simultaneously mixing a relatively large amount of B and N. More specifically, with regard to a $Ga_xB_{1-x}N_zP_{1-z}$ mixed crystal, a stable mixed crystal can be obtained, when its composition substantially satisfies $x = z$. When such a mixed crystal is observed with a transmission electron spectroscope, an ordering phenomenon is observed, in which Ga and N, and B and P are selectively bonded to each other and aligned. It is clear from the Ga-N and B-P bonds that the energy of the total system is lowered, and the mixed crystal is stable. It can be concluded from these facts that in order to obtain a stable mixed crystal, lattice constants or lattice configurations need not necessarily be matched with each other, and it is important that constituent elements have the same bond length.

According to a second aspect of the present invention, therefore, a $Ga_xAl_yB_{1-x-y}N_zP_{1-z}$ mixed crystal preferably has a composition of $x+y=z$, thus providing a compound semiconductor material in which ordering of Ga-N, Al-N, and B-P bonds is structurally caused.

In addition, the present invention is characterized in that a semiconductor element is formed by using a $Ga_xAl_{1-x}N$ layer which is processed in the above-described manner to have a ZB type crystal structure.

According to a third aspect of the present invention, when the above-described semiconductor element is to be manufactured, a metal organic chemical vapor deposition apparatus having a plurality of reaction tubes is used, and a substrate is moved between the reaction tubes so as to sequentially grow a BP layer and a $Ga_xAl_{1-x}N$ layer on the substrate, thereby forming a heterojunction.

According to the present invention, by growing a $Ga_xAl_{1-x}N$ layer on a BP layer having a ZB structure, a $Ga_xAl_{1-x}N$ having a ZB structure can be obtained. Therefore, an excellent compound semiconductor material having a large band gap, allowing easy p-n junction control, and having good crystal quality can be obtained. Similarly, if a mixed crystal is manufactured by mixing GaN, Al, and BP, an excellent compound semiconductor material of a ZB structure having a large band gap can be obtained. A light-emitting element for emitting light of a short wavelength which is shorter than that of green light can be realized by using these materials.

According to a method of the present invention, a metal organic chemical vapor deposition apparatus having a plurality of reaction tubes is used, and a substrate is moved between these reaction tubes so that the respective source gases can alternately be fed onto the substrate with abrupt changes in concentration within a very short period of time. With this process, BP layers and $Ga_xAl_{1-x}N$ layers can be alternately stacked on the substrate at a desired stacking cycle, thus obtaining an element wafer having a multilayer structure.

BRIEF DESCRIPTION OF THE DRAWINGS

FIG. 1A is a graph showing a band structure of a cubic semiconductor having a ZB type crystal structure;

FIG. 1B is a graph showing a band structure of a cubic semiconductor having a WZ type Crystal structure;

FIG. 2 is a view for explaining a compound semiconductor wafer according to an embodiment of the present invention;

FIG. 12 is a graph for explaining a relationship between the stacking period and the resistivity of the wafer in FIG. 10;

FIG. 13 is a view for explaining an embodiment in which a single-heterojunction type LED is constituted by a GaAlN/BP superlattice layer;

FIG. 14 is a graph for explaining a relationship between the nitrogen component ratio and the luminance of the LED in FIG. 14;

FIG. 15 is a view for explaining an embodiment in which a double-heterojunction type laser is constituted by a GaAlN/BP superlattice layer;

FIG. 16 is a graph for explaining a relationship between the nitrogen component ratio of the superlattice layer and the threshold current of the laser in FIG. 15;

FIG. 17 is a graph for explaining a relationship between the composition deviation and the half-value of the black peak upon X-ray diffraction of a $Ga_xAl_yB_{1-x-y}N_zP_{1-z}$ according to the present invention;

FIGS. 18 to 20 are views each for explaining an LED whose light emission efficiency is improved according to an embodiment of the present invention;

FIGS. 21 to 23 are views each for explaining a laser in which a buffer multilayer is interposed according to an embodiment of the present invention;

FIGS. 28 and 29 are views for explaining lasers to which selective doping in FIGS. 27A and 27B is applied according to embodiments of the present invention;

DETAILED DESCRIPTION OF THE PREFERRED EMBODIMENTS

Embodiments of the present invention will be described below.

FIG. 2 shows a semiconductor wafer having a superlattice structure of GaN/BP according to an embodiment of the present invention. In this embodiment, a GaP layer 2 as a buffer layer is formed on a GaP substrate 1. BP layers 3 and GaN layers 4 are alternately stacked on the GaP layer 2 at a predetermined cycle.

Figure 3:
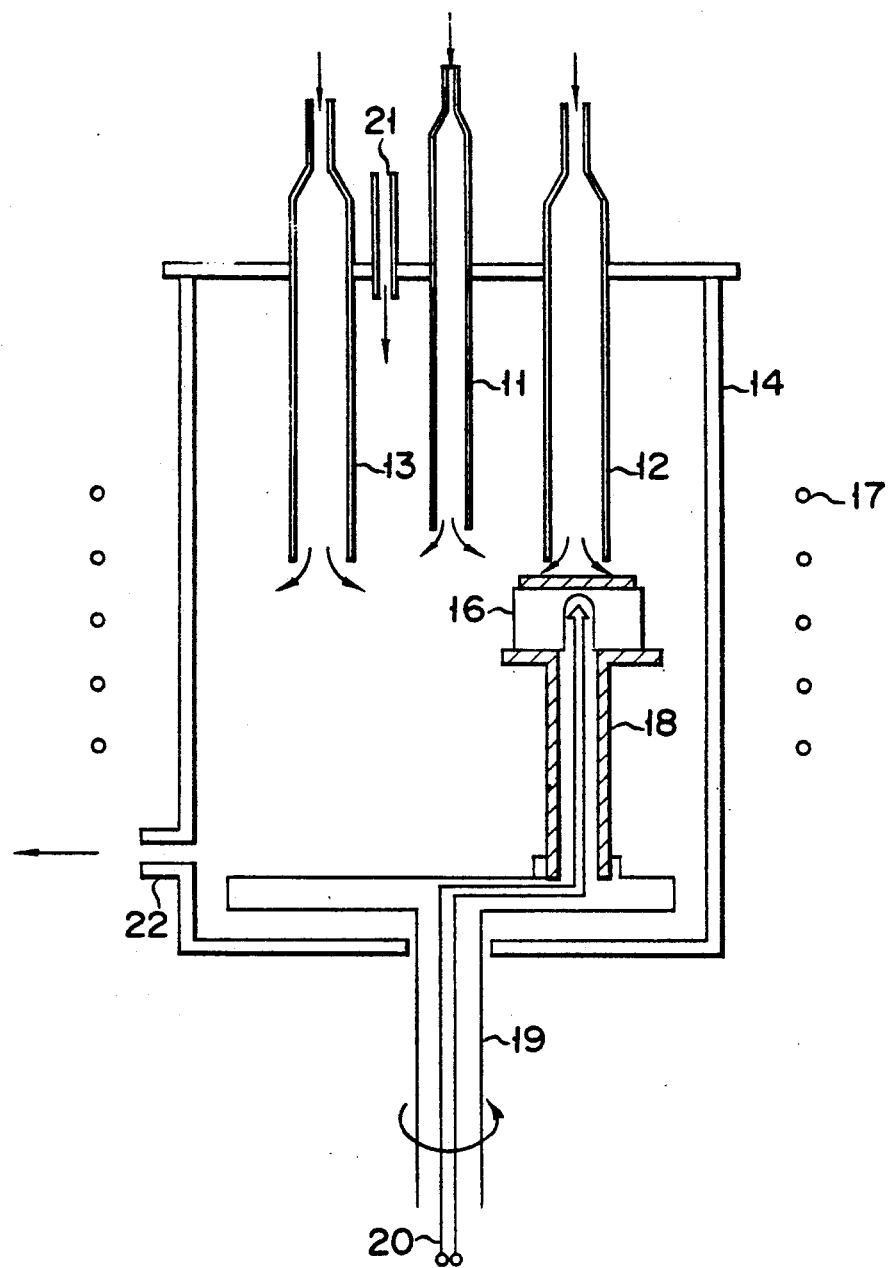
FIG. 3 is a view for explaining an MOCVD apparatus for manufacturing the wafer in FIG. 2.

FIG. 3 shows a metal organic chemical vapor deposition (MOCVD) apparatus of a multi-chamber system used to manufacture such a superlattice structure semiconductor wafer. Referring to FIG. 3, reference numerals 11, 12, and 13 denote quartz reaction tubes. Required source gases are respectively fed into the reaction tubes 11, 12, and 13 through gas feed ports respectively arranged at their upper portions. These reaction tubes 11, 12, and 13 are vertically mounted on a chamber 14 so as to extend through the upper lid of the chamber 14. A substrate 15 is placed a graphite susceptor 16. More specifically, the substrate 15 is placed on the susceptor 16 so as to oppose the openings of the reaction tubes 11, 12, and 13, and is heated to a high temperature by an external high-frequency coil 17. The susceptor 16 is mounted on a quartz holder 18. The susceptor 16 can be moved by a driving shaft through a magnetic fluid seal at high speed under the reaction tubes 11, 12, and 13. This driving operation is performed by a computer-controlled motor which is arranged outside the apparatus. A thermocouple 20 is arranged at the central portion of the susceptor 16. The thermocouple 20 monitors temperatures immediately under the substrate and extracts them. A slip ring is used for a code portion of the thermocouple 20 so as to prevent a twist due to rotation. A reacted gas is pushed by a fast downflow of a hydrogen gas flowing from an upper injection port 21 and is exhausted from an exhaust port 22 by a rotary pump so as to suppress mixing of the gases.

In the above-described MOCVD apparatus, desired source gases are fed through the reaction tubes 11, 12, and 13. The substrate 15 is moved by the computer-controlled motor. With this operation, a multilayer structure can be formed on the substrate 15 at an arbitrary stacking period and with an arbitrary composition. In this system, abrupt changes in concentration can be easily realized, which cannot be obtained by a gas switching system. In addition, according this system, in order to form a steep hetero-interface, gases need not be switched at high speed. For this reason, the problem of slow decomposition rates of $NH_3$, $P_3$, and the like as source gases can be solved by setting their flow rates to be low.

A semiconductor wafer shown in FIG. 2 in detail was manufactured by using the MOCVD apparatus shown in FIG. 3. The properties of a crystal layer of the manufactured wafer were checked. The results will be described below. The source gases used were: trimethyl gallium (TMG) of a methyl-based organic metal, trimethyl aluminum (TMA), diborane ($B_2H_6$), or triethyl boron (TEB); phosphine ($PH_3$); and ammonia ($NH_3$). The temperature of the substrate 15 was set at 850° to 1,150° C.; the pressure, 0.3 atm; and the total flow rate of the source gases, 1 l/min. The gas flow rates were determined to set the growth rate at 1 μm/h. More specifically, the flow rates of the respective source gases were: $1 \times 10^{-6}$ mol/min for TEB; $1 \times 10^{-6}$ mol/min for TMG; $5 \times 10^{-4}$ mol/min for $PH_3$; and $1 \times 10^{-3}$ mol/min for $NH_3$. The stacking cycle was 50 to 300 Å. The film thickness ratio ($D_{BP}/D_{GaN} = r$) of the BP layer 3 to the Ga layer 4 was kept at 1 or 2.

While the obtained superlattice layer was etched by Ar ions, the signals of B and Ga were traced by Auger electron spectroscopy. As a result, it was found that an abrupt change in concentrations occurred at each interface. This abrupt change was substantially equivalent to the escape length of an Auger electron, i.e., about 3 nm. In addition, the long period structure of a 50-cycle superlattice layer was checked upon small-angle scattering of X-rays to find an excellent long-range order.

When hole measurement of a GaN layer of the manufactured superlattice layer was performed, it was found that the layer was of an n conductivity type having a carrier concentration of about $1 \times 10^{16}$ atoms/$cm^3$, and had very few holes of N atoms. It was confirmed that when TMG was substituted by TMA, GaN was mixed with $Ga_xAl_{1-x}N$ to form a mixed crystal, and a superlattice layer consisting of the mixed crystal and a BP layer was obtained. The electric resistance of this superlattice layer was greatly increased when x was 0.4 or more, and the layer acquired a high resistance so that it could be almost regarded as an insulating layer.

A GaN/BP superlattice was formed by setting the stacking cycle to be 60 Å or less while r=2 was kept. It was found from diffraction patterns from an X-ray diffractometer that reflection representing a WZ structure based on GaN became unclear. When the stacking cycle was 40 Å or less, reflection representing that both the GaN and BP layers had ZB structures was recognized. However, the lattice was distorted. Thus, it was confirmed that if the thicknesses of each stacked layer was properly selected, a GaN having a ZB structure could be synthesized. While the thickness of a BP layer was set to be 70 Å, the thickness of a GaN layer was changed. As a result, a GaN layer having a ZB structure was grown up to 50 Å, and its band gap was linearly increased with an increase in thickness of the GaN layer.

A similar result was obtained when an AlN layer was grown in place of a GaN layer. Therefore, it was confirmed that if a film thickness ratio was changed, or a $Ga_xAl_{1-x}N$ was grown and a composition ratio x was changed, a band gap could be changed while a lattice constant was kept constant. In addition, it was recognized that if the film thickness ratio of a $Ga_xAl_{1-x}N$ layer to a BP layer was 1.0 or more, an indirect transition type structure was converted into a direct transition type structure.

As described above, a superlattice layer exhibits an n conductivity type without doping. However, when Zn was doped by mixing dimethylzinc (DMZ) with the source gases, a p-type crystal was obtained. A carrier concentration as well as a conductivity type could be controlled by changing the amount of DMZ.

As described above, according to this embodiment, a steep heterojunction of a nitride (GaAlN, GaN, and AlN) and a phosphide (BP), which was difficult to form in the past, can be formed. Therefore, a compound semiconductor wafer of a ZB structure allowing easy p-n junction control and having a large band gap (2.7 eV) can be obtained. A high-luminance blue LED and a green light semiconductor laser can be formed by using this semiconductor wafer.

Figure 4:
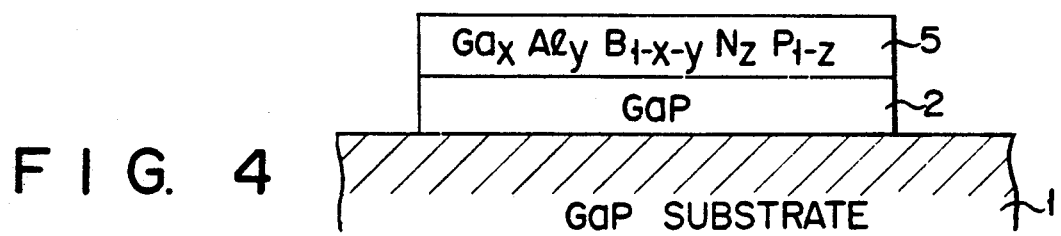
FIG. 4 is a view for explaining a compound semiconductor wafer according to another embodiment of the present invention.

FIG. 4 shows a semiconductor wafer according to another embodiment of the present invention. In this embodiment, a $Ga_xAl_yB_{1-x-y}N_zP_{1-z}$ layer 5 as a mixed crystal is grown on a GaP substrate 1 through a GaP layer 2 as a buffer layer.

Figure 5:
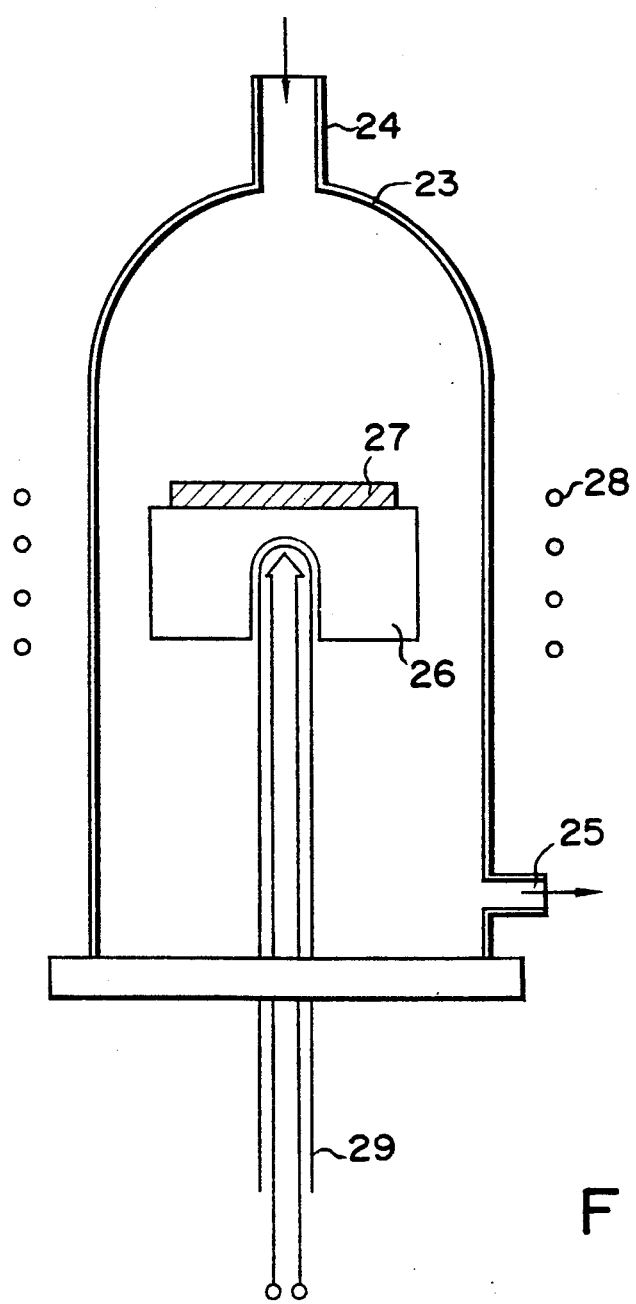
FIG. 5 is a view explaining an MOCVD apparatus for manufacturing the wafer in FIG. 4.

FIG. 5 shows an MOCVD apparatus for manufacturing the semiconductor wafer shown in FIG. 4. Reference numeral 23 denotes a quartz reaction tube. Source gases are fed from a gas feed port 24 located at the upper portion of the reaction tube 23. Gases in the reaction tube 23 are exhausted from an exhaust port 25. A substrate 27 is mounted on a graphite susceptor 26 and is arranged in the reaction tube 23. The substrate 27 is induction-heated by an external high-frequency coil 28. Reference numeral 29 denotes a thermocouple for detecting the temperature of the susceptor 26.

As shown in FIG. 4, a GaP layer 2 was grown on a GaP substrate 1, and a $Ga_xAl_yB_{1-x-y}N_zP_{1-z}$ ($0 \leq x, y, z \leq 1$) was grown on the resultant structure by using the MOCVD apparatus shown in FIG. 5. The source gases were: trimethyl gallium (TMG) of a methyl-based organic metal, trimethyl aluminum (TMA), diborane ($B_2H_6$), or triethyl boron (TEB); phosphine ($PH_3$); and ammonia ($NH_3$). The substrate temperature was set to be 850° to 1,150° C.; and the pressure, 0.3 Torr. The flow rates of the respective source gases were set such that the contents of N, Al, D, and P became substantially the same.

Surface analysis and composition analysis of the obtained $Ga_xAl_yB_{1-x-y}N_zP_{1-z}$ layer 5 were performed by using characteristic X-rays generated by an electron probe. As a result, it was confirmed that the contents of N, Al, B, and P were substantially the same. At the same time, it was confirmed from X-ray diffraction that the overall layer was epitaxially grown so as to have a ZB structure. In addition, upon observation using a transmission electron spectroscope, a uniform lattice face was recognized, and no cluster area was present.

In order to obtain a p-type crystal, a similar crystal growth process was performed by mixing diethylzinc (DEZ) with a source gas. It was confirmed that the obtained crystal has a resistivity of $10^5 \Omega \cdot cm$ and was of a g conductivity type. Its photoluminescence was checked.

Similarly, in this embodiment, a mixed crystal layer consisting of BP and GaAlN which has a large band gap, allows easy p-n junction control, and is excellent in crystal quality can be obtained.

Embodiments in which the present invention is applied to practical elements will be described below.

Figure 6:
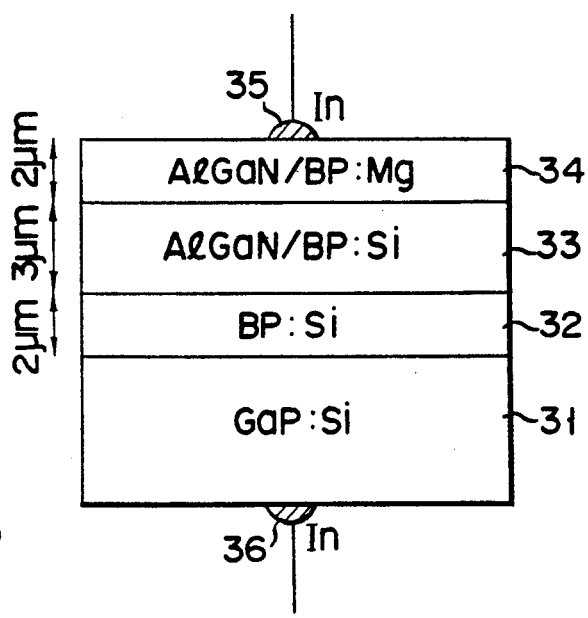
FIG. 6 is a view for explaining an embodiment in which the present invention is applied to an LED.

FIG. 6 shows an embodiment in which an LED employs a GaAlN/BP superlattice layer. An Si-doped n-type BP layer 32 is grown on an Si-doped n-type GaP substrate 31 to a thickness of about 2 μm. An Si-doped n-type GaAlN/BP superlattice layer 33 having a thickness of about 3 μm and a Mg-doped p-type GaAln/BP superlattice layer 34 having a thickness of about 2 μm are sequentially grown on the BP layer 32. Crystal growth is performed by the MOCVD apparatus shown in FIG. 3. More specifically, the superlattice layers 33 and 34 are formed by alternately stacking $Ga_{0.5}Al_{0.5}N$ and BP layers, and hence layers having a thickness of $10\text{Å} + 10 \text{Å}$ are repeatedly stacked. The n-type superlattice layer 33 is formed by using silane ($SiH_4$) as a dopant so as to have a carrier concentration of $1 \times 10^{17}$ atoms/cm$^3$, whereas the p-type superlattice layer 34 is formed by using cyclopentadienyl magnesium ($CP_2Mg$) as a dopant so as to have a carrier concentration of $2 \times 10^{16}$ atoms/cm$^3$. In (indium) electrodes 35 and 36 are respectively formed on the upper and lower surfaces of the element wafer.

With this structure, high-luminance blue light emission can be realized.

Figure 7:
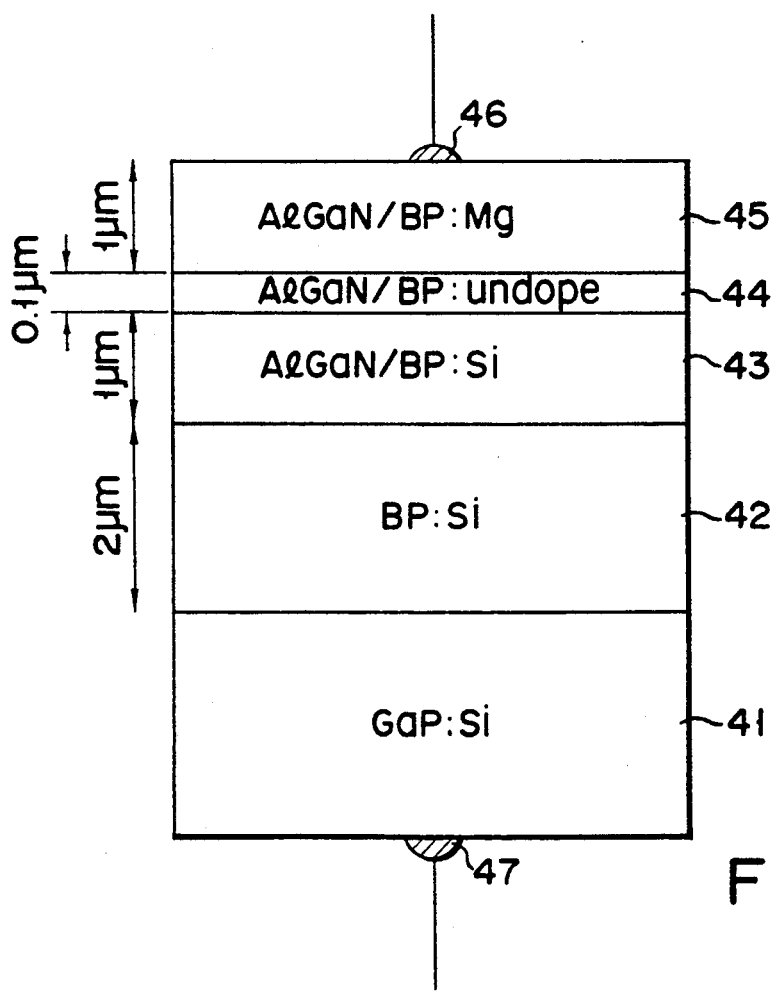
FIG. 7 is a view for explaining an embodiment in which the present invention is applied to a DH laser.

FIG. 7 shows an embodiment in which a DH laser is formed by using a GaAlN/BP superlattice layer. Similar to the above-described embodiment, in this embodiment, the MOCVD apparatus shown in FIG. 3 is used to form the superlattice layer. More specifically, an Si-doped n-type BP layer 42 as a buffer layer is formed on an n-type GaP substrate 41. An Si-doped n-type GaAlN/BP superlattice layer 43 is grown on the BP layer 42 to a thickness of about 1 μm, and an undoped GaAlN superlattice layer 44 is grown on the resultant structure to a thickness of about 0.1 μm. In addition, an Mg-doped p-type GaAlN/BP superlattice layer 45 is grown on the resultant structure to a thickness of about 1 μm. The undoped superlattice layer 44 serves as an active layer. Each of the superlattice layers 43 to 45 has a composition of $Ga_{0.5}Al_{0.5}N$ and BP layers which are alternately stacked. Each of the p- and n-type superlattice layers 45 and 43 is formed at a cycle of $7 \text{Å} + 13 \text{Å}$, i.e., 20 Å and has a band gap of about 3.0 eV. The undoped superlattice layer 44 is formed at a cycle of $5 \text{Å} + 5 \text{Å}$, i.e., 10 Å and has a band gap of 2.7 eV. The n-type superlattice layer 43 is formed upon doping of Si using $SiH_4$ and has a carrier concentration of $1 \times 10^{17}$ atoms/cm$^3$. The p-type superlattice layer 45 is formed upon doping of MB using $CP_2Mg$ and has a carrier concentration of $1 \times 10^{17}$ atoms/cm$^3$. In (indium) electrodes 46 and 47 are formed on the upper and lower surfaces of the resultant structure, respectively.

Blue emission can be realized by the DH layer of this embodiment.

The present invention is not limited to the above-described embodiments. For example, In, Tl, and the like as Group III elements may be mixed in place of Ga, Al, and B, and As, Sb, Bi, and the like may be mixed as Group V elements. As source gases, triethyl gallium (TEA) can be used for Ga; an ethyl group organic metal such as triethyl aluminum (TEA), for Al; and trimethyl boron (TMB), for B. In place of ammonia as a source material for N, a nitrogen gas, hydrazine ($N_2H_4$), or an organic metal compound called an adduct such as $Ga(C_2H_5)_3 \cdot NH_3$, $Ga(CH_3)_3 \cdot N(CH_3)$, $Al(C_2H_5)_3 \cdot NH_3$, or $Al(CH_3)_3 \cdot N(CH_3)_3$ may be used.

The compound semiconductor materials of the present invention, i.e., a GaAlN and BP superlattice structure semiconductor or a mixed crystal semiconductor of $Ga_xAl_yB_{1-x-y}N_zP_{1-z}$ is is composed of a combination of direct and indirect transition types and a combination of WZ and ZB structures having different characteristics. For this reason, problems posed in such a material are that the bond lengths of Al-N and B-N are especially short as compared with other bond lengths, and AlN has a high resistance. As described above, in order to allow stable existence of this semiconductor material, it is essential that $x + y$ is substantially equal to z.

Crystal structures pose an important problem. Generally, a crystal having a strong ionization tendency tends to have a hexagonal structure, and doping of a p-type impurity tends to be difficult. This may be because heavy holes release degeneracy of a band due to the effects of the crystalline filed based on strong uniaxial isotropy of a hexagonal structure, and constitute a band constituting a valence band apex. For this reason, it is considered that satisfactory p-n junctions cannot be obtained from Group II-VI compounds which tend to have WZ structures. In view of the above-described points, crystals having Cubic structures are essential to formation of p-n junctions. Since AlN and GaN have large band gaps of 6.2 eV and 3.4 eV, respectively, and are of direct transition type, they are preferably used for formation of p-n junctions. However, both crystals of AlN and GaN have WZ structures. A compound BP of B and P which are the remaining constituent elements has a small band gap of about 2.0 eV and is of an indirect transition type. However, it has a ZB structure. Therefore, the lower limit of B and P as ZB type compounds which is necessary to keep a crystal to be of a ZB type is determined. According to the experiments performed by the present inventors, it was required that the lower limit of B and P components was 0.2, i.e., $x+y \simeq z \leq 0.8$. If it exceeds 0.2, some crystals started exhibiting a WZ structure.

Figures 8, 9:
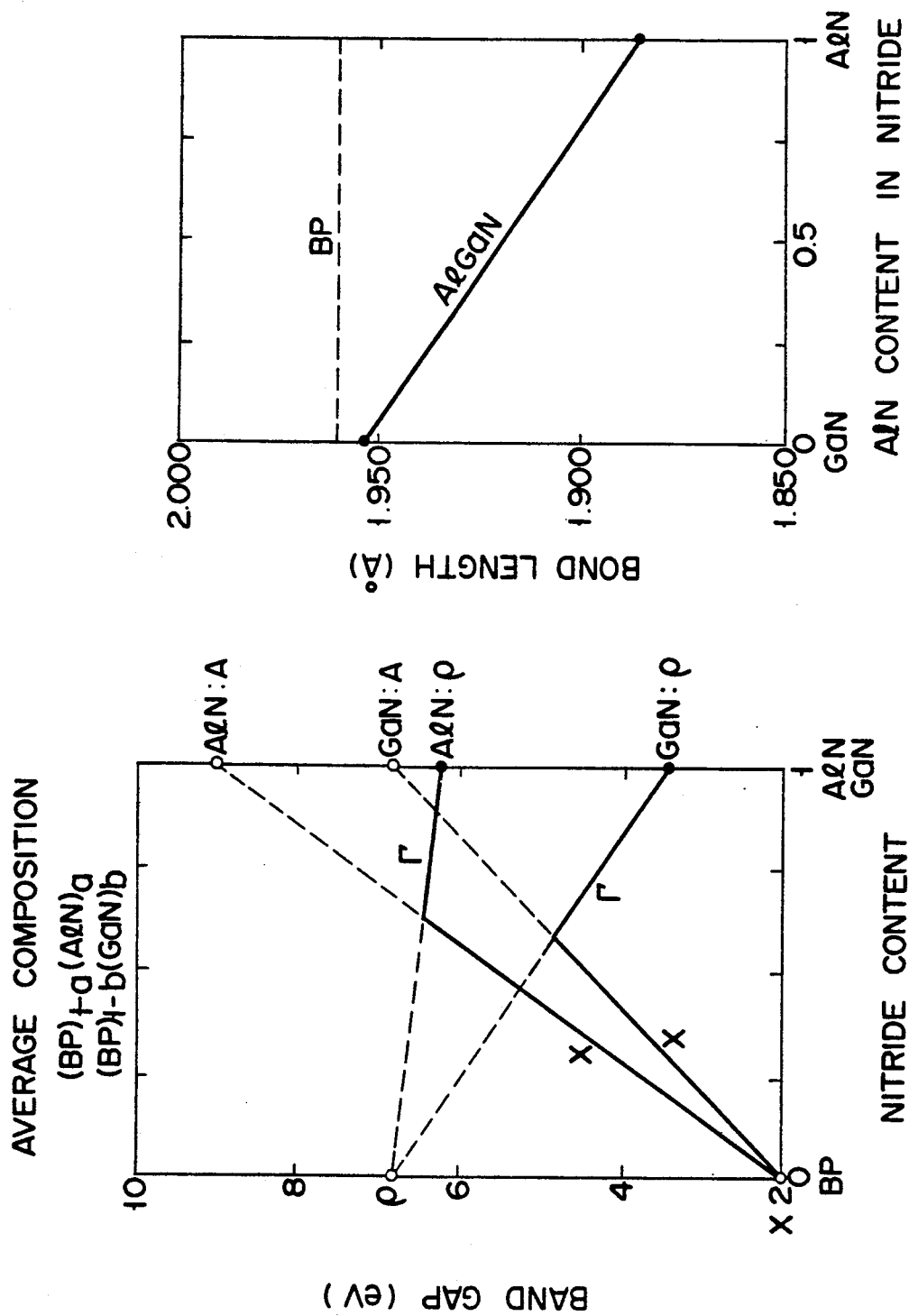
FIG. 8 is a graph for explaining a relationship between the composition and band gap of a compound semiconductor material according to the present invention.
FIG. 9 is a graph for explaining a relationship between the composition and the bond length of the material in FIG. 8.

Band structures pose another problem. BP is of an indirect transition type which has a valence band at the X point. Al is of a direct transition type which has the bottom of a valence band at the $\Gamma$ point. FIG. 8 shows changes in band gap and position of the bottom of a valence band based on the composition of a mixed crystal expected from these materials. More specifically, FIG. 8 shows changes in band structure due to two pseudo two-element composition ($Al_aN_aB_{1-a}P_{1-a}$, $Ga_bN_bB_{1-b}P_{1-b}$; $0 \leq a, b \leq 1$) of BP and AlN, and BP and GaN. Referring to FIG. 8, reference symbols X, $\Gamma$, and A denote positions of the bottoms of valence bands. Such a linear approximation is considered as a satisfactorily accurate approximation in a mixed crystal of GaAs-AlAs. A laser which can perform stable oscillation has not been realized by indirect transition type materials. In order to realize light-emitting elements, it is important to use direct transition type materials. Therefore, the ratio of a nitride component to a boride component is set to be large to convert an indirect transition type material to a direct transition type material. It is apparent from FIG. 8 that a band structure is substantially determined on the basis of the value $x+y$, and that a band structure does not much depend on the ratio of x to y. Therefore, with regard to a superlattice layer and a mixed crystal layer, in order to maintain a direct transition type, an average composition falls in the range of $0.6 \leq x+y \simeq z$, in which the content of a nitride is large.

The component ratio of Group III elements must be considered. If the concentration of Al is increased, an AlN component is increased in amount to effectively increase a band gag. However, AlN has a small lattice constant or bond length as compared with GaN and BP. Therefore, AlN is not preferable in terms of lattice matching. In addition, AlN has generally a high resistivity of $10^{10}$ $\Omega \cdot$ cm or more, and hence poses a problem as a constituent element. When a mixed crystal is to be formed by using AlN, if a bond of Al-P is formed, a cubic crystal having a low resistance can be formed. However, it has a long bond length of 2.36 Å. This may lead to formation of an unstable indirect transition type compound AlP, and hence an increase in Al concentration is not desirable.

FIG. 9 shows changes in bond length of a mixed crystal AlGaN with respect to a composition. When Al:Ga=1:1, a band gap is about 4.8 eV which is large enough to correspond to an ultraviolet region. However, mismatching of bond lengths reaches 2% with respect to BP. Therefore, a content y of Al need be limited to about $y \leq 2x$.

With regard to a superlattice layer, electrons tend to locally exist in one of the layers. If electrons are locally present in a thick layer compared a mean free path, the characteristics of a superlattice structure cannot be obtained. In addition, since electric conductivity is lowered, formation of an element becomes difficult. Therefore, the upper limit of a stacking cycle is inevitably determined.

An embodiment in which the above-described preferable compositions and the like are taken into consideration will be described below.

Figure 10:
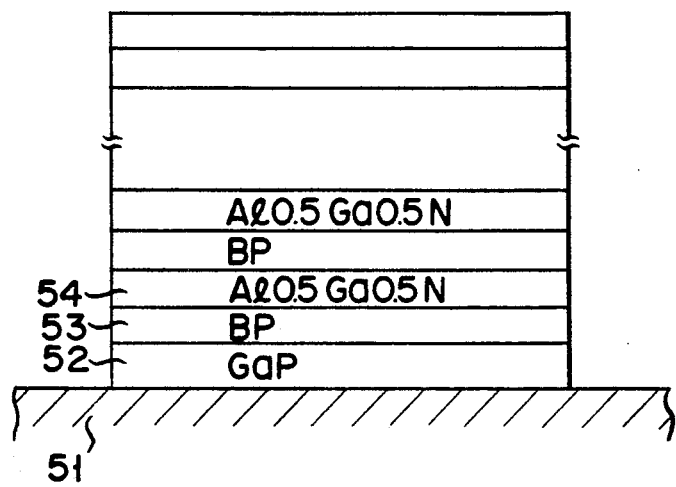
FIG. 10 is a view for explaining a GaAlN/BP multilayer wafer.

FIG. 10 shows a GaAlN/BP superlattice structure wafer of such an embodiment. The MOCVD apparatus shown in FIG. 3 was used to manufacture this superlattice structure wafer. According to this wafer, a GaP layer 52 as a buffer layer was formed on a GaP substrate 51. BP and GaAlN layers 53 and 54 were alternately stacked on the GaP layer 52. The stacking cycle was set to be 50 to 300 Å. The thicknesses of the BP and GaAlN layers 53 and 54 were set as 1:1. The source gases were: trimethyl aluminum (TMA); trimethyl gallium (TMG); triethyl boron (TEB); ammonia ($NH_3$); and phosphine ($PH_3$). The substrate temperature was set to be 850° to 1,150° C.; the pressure, 0.3 atm; and the total flow rate of the source gases, 1 l/min. The gas flow rates were set so as to set a growth rate of 1 $\mu$m/h. The approximate gas flow rates were: TMA: $1 \times 10^{-6}$ mol/min; TMG: $1 \times 10^{-6}$ mol/min; TEB: $1 \times 10^{-6}$ mol/min; $PH_3$: $5 \times 10^{14}$ mol/min; and $NH_3$: $1 \times 10^{-3}$ mol/min. Doping was performed by mixing silane ($SiH_4$) and cyclopentadienyl magnesium ($CP_2Mg$) with the source gases.

The properties of the obtained superlattice structure wafer were measured. In hole measurement of an undoped GaN layer which was grown in a preliminary step, the layer exhibited an n conductivity type having a carrier concentration of $1 \times 10^{16}$ atoms/cm$^3$ and a hole mobility of about 150 cm$^2$/V sec. That is, it was confirmed that the number of holes of N atoms was very small. The AlN layer exhibited a high resistivity of $1 \times 10^6$ $\Omega \cdot$ cm or more. As a nitrogen portion of a superlattice layer of a stacking cycle of 40 Å was converted into a mixed crystal with AlN, the electric resistance was greatly increased when a value w was 0.65 or more in the range of a composition of $Al_wGa_{1-w}N$ ($0 \leq w \leq 1$), and the crystal itself began to deteriorate.

Figure 11:
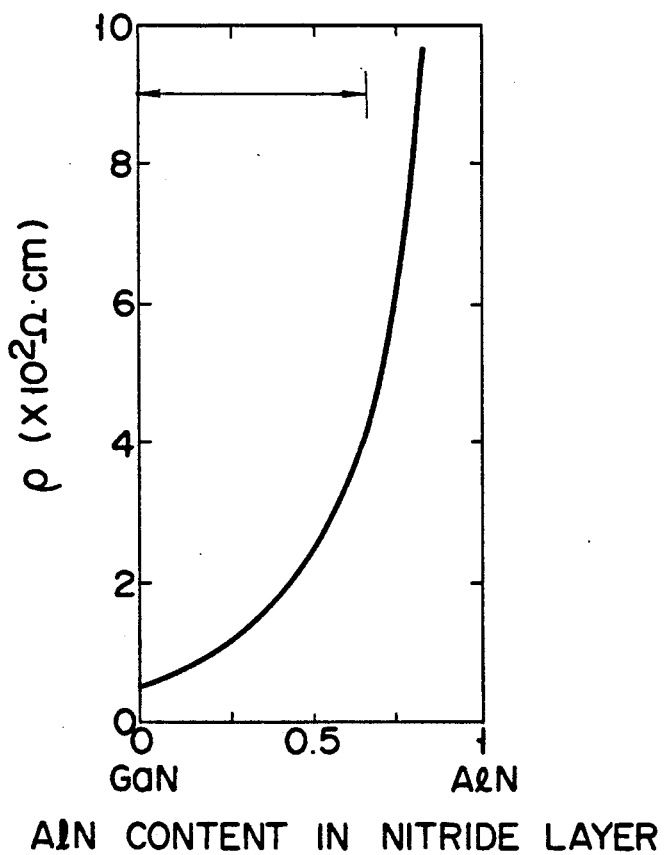
FIG. 11 is a graph for explaining a relationship between the composition and the resistivity of the wafer in FIG. 10.

FIG. 11 shows changes in resistivity $\rho$ of this superlattice structure due to its Al composition. It is apparent from FIG. 11 that the ratio of the content of Al to that of Ga should be limited to 2:1 at maximum.

FIG. 12 shows results obtained by checking changes in resistivity when only a staking cycle is changed while the composition ratio of a nitrogen layer is fixed to $Ga_{0.5}Al_{0.5}N$. If the stacking cycle is very small, i.e., a layer having a thickness corresponding to a few atoms, the effects of structural disturbance or defects are strong. In this case, the resistance tends to be large. Generally, the resistance is almost equal to that of a single GaN layer. However, the resistance begins to increase at a stacking cycle of about 50 Å, and reaches three times larger than that of a layer of a short cycle at 100 Å. This may be because electrons are locally present in one of the layers.

According to the method of the present invention, if the ratio of the thickness of an AlGaN to that of a BP layer ($r = D_{AlGaN}/D_{BP}$) or the content w of $Al_w$-$Ga_{1-w}N$ is changed, a band gap can be changed while lattice constants are kept unchanged. Therefore, it is considered that a semiconductor layer having required characteristics can be obtained by predicting and rowing a composition and stacking structure on the basis of the principle of the present invention by using the apparatus shown in FIG. 3. However, it is found from formation of a multilayer wafer that a semiconductor layer having a large band gap cannot necessarily be obtained from an arbitrary composition and an arbitrary stacking structure.

FIG. 13 shows a sectional structure of a single-heterojunction type LED which is prepared as a sample by using the above-described superlattice structure semiconductor. A p-type BP layer 62 having a thickness of 2 $\mu$m and a carrier concentration of $3 \times 10^{17}$ atoms/cm$^3$ as a buffer layer is formed on a Zn-doped p-type GaP substrate 61 having a carrier concentration of $5 \times 10^{17}$ atoms/cm$^3$. A p-type Al$_{0.5}$Ga$_{0.5}$N/BP superlattice layer 63 having a thickness of 2 $\mu$m and a carrier concentration $1 \times 10^{17}$ atoms/cm$^3$ and an n-type Al$_{0.5}$Ga$_{0.5}$N/BP superlattice layer 64 having a thickness of 2 $\mu$m and a carrier concentration of $1 \times 10^{16}$ atoms/cm$^3$ are sequentially formed on the resultant structure. By changing a film thickness ratio r of a superlattice layer at this portion, the band gap is changed. An n-type GaN layer 65 as a contact layer is formed on the resultant structure. Ohmic electrodes 66 and 67 are formed on the upper and lower surface of the LED.

FIG. 14 shows changes in luminance of the LED thus obtained due to an average composition ratio z. In this case, an average composition satisfies $x+y=z$, and a superlattice structure is realized by using the nitrogen composition ratio z as a parameter. Almost no light emission occurs in the range in which the value z is small, and an indirect transition BP layer occupies most of the region of the LED. As the value z is increased, the band structure is converted from a direct transition type to an indirect transition type from $z=0.5$. Therefore, its luminance is abruptly increased. With an increase in value z, the band gap is increased. As a result, the wavelength of emitted light is shortened. The luminance reaches its maximum value near $z=0.7$, and is abruptly lowered thereafter. The reason why the luminance is decreased in this manner is that some crystals are converted into a WZ structure, and an excellent p-type crystal cannot be obtained. More specifically, in this range, it is difficult to form a p-type crystal having a low resistance. Upon X-ray diffraction, peaks representing a ZB structure become obscure, and reflection due to a WZ structure will be actually recognized. At $z=0.85$ or more, most of the crystals are converted into a WZ structure, and hence no p-type layer can obtained, and no light emission is not recognized.

FIG. 15 is a sectional view of a double-heterojunction (DH) type laser employing a superlattice structure similar to the one described above. An Si-doped p-type BP buffer layer 72 having a carrier concentration of $5 \times 10^{17}$ atoms/cm$^3$ is formed on an Si-doped n-type GaP substrate 71 having a carrier concentration of $1 \times 10^{18}$ atoms/cm$^3$ so as to have a thickness of 2 $\mu$m. An n-type AlGaN/BP superlattice layer (Si doping; carrier concentration: $1 \times 10^{17}$ atoms/cm$^3$; 1 $\mu$m) 73 as a first clad layer, an undoped AlGaN/BP superlattice layer (carrier concentration: $2 \times 10^{16}$ atoms/cm$^3$; 0.1 $\mu$m) 74 as an active layer, and a p-type AlGaN/BP superlattice layer (Mg doping; carrier concentration: $1 \times 10^{17}$ atoms/cm$^3$; 1 $\mu$m) 75 second clad layer are sequentially formed on the resultant structure. Thereafter, an n-type BP layer (Si doping; carrier concentration: $2 \times 10^{17}$ atoms/cm$^3$; 1 $\mu$m) 76 having a striped opening as a current limit layer is formed on the resultant structure. A p-type BP layer (Mg doping; carrier concentration: $5 \times 10^{17}$ atoms/cm3, 77 as a contact layer is formed on the resultant structure. Ohmic electrodes 78 and 79 are formed on the upper and lower surfaces of the resultant structure, thus completing a DH laser.

FIG. 16 shows results obtained by measuring changes in threshold current density with changes in content z of the superlattice semiconductor of this DH laser in the same manner as that of the LED described above. Similar to the LED described above, $x+y=z$ is satisfied. When a nitrogen composition ratio $z=0.45$, the threshold value is at about 100 KA/cm$^2$. The threshold value is at the minimum value, i.e., 50 KA/cm$^2$ near $z=0.75$. when $z=0.85$ or more, the threshold value is abruptly increased, and oscillation becomes to be impossible. It was confirmed that a satisfactory p-n junction could not be formed by using only nitrides, and hence a light-emitting element could not be manufactured.

In the above-described embodiments, the LED and DH laser employ superlattice semiconductors to form light-emitting layers, and the film thickness ratio g is changed while the composition ratio of Al to Ga and the stacking cycle of each superlattice layer are fixed in order to change band gaps. However, the band gaps can be more easily changed by changing the composition ratio of Al to Ga. In this case, if the Al concentration is simply increased, only a high-resistance n-type layer can be obtained. If the band gaps are to be changed by this method, the content of nitride components must be decreased to a certain value.

In the embodiments of the above-described LED and DH laser, the superlattice layer semiconductor may be substituted by a mixed crystal semiconductor having a composition of Ga$_x$Al$_y$B$_{1-x-y}$N$_z$P$_{1-z}$ ($0 \leq x, y, x+ \leq z$) of a ZB type. In order to obtain such a mixed crystal by using the MOCVD apparatus shown in FIG. 3, movement of a substrate which is subjected to crystal growth is stopped, and a reaction gas obtained by mixing predetermined components is fed through a single reaction tube. In this case, however, in order to prevent a reaction between source gases, it is important to mix the reaction gas in the immediately preceding stage of the reaction tube.

Such a mixed crystal was actually manufactured, and it was confirmed upon X-ray diffraction that the overall crystal was epitaxially grown to have a ZB type structure at the range of $x+y=z \leq 0.75$. Upon observation of a transmission electron microscope, a uniform lattice face was observed, and no cluster area was observed. In a sample having a composition of Al and B set as 1:1 without Ga, the electric resistivity of a crystal was set at a relatively high value of $10^5$ $\Omega$·cm or more. In hole measurement, the mixed crystal had an n-type carrier concentration of about $10^{18}$ atoms/cm$^3$. As is generally assumed, this phenomenon is probably based on N atom holes of the AlN layer. The hole mobility was as low as about 50 cm$^2$/V sec. When mixed crystals were formed with a deviation of 5% or more from the condition of $z=x+y$, it was confirmed that the half-width of a black peak was increased to 0.2 degree or more, and the peak intensity was greatly decreased.

FIG. 17 shows changes in half-width with respect to composition deviation $\delta$ when $x=0.2$, $y=0.3$, and $z=0.5\pm\delta$. When the deviation $\delta$ is large, it cannot be assumed that a uniform mixed crystal layer is epitaxially grown on a substrate. A mixed crystal can be grown with a large degree of freedom in the range of composition ratios. However, a single crystal having a uniform composition cannot be obtained even in a small region.

When a light-emitting element is to be formed by using new compound semiconductor materials of the present invention, selection of a substrate which is transparent to emission wavelengths and allows lattice matching is difficult. For this reason, light extraction efficiency is undesirably degraded due to light absorption of a substrate. In addition, a stress acts on a light-emitting layer due to lattice mismatching. Embodiments in which the above-described drawbacks are eliminated will be described below. In the subsequent embodiments, similar to the above-described embodiments, a semiconductor layer having a large band gap and composed of a superlattice structure or a mixed crystal is formed on a substrate. Thereafter, the substrate or a buffer layer is removed to improve light extraction efficiency.

FIG. 18 shows an LED having a double-heterojunction structure according to one of the above embodiments. This LED comprises a double-heterojunction structure consisting of a p-type AlGaN/BP superlattice layer 81, an undoped AlGaN/BP superlattice layer 82, and a n-type AlGaN/BP superlattice layer 83, and a thick n-type AlGaN contact layer 84 having a WZ structure formed on the double-heterojunction structure. Ohmic electrodes 85 and 86 are respectively formed on the n- and p-type layer sides.

This LED is manufactured by using the MOCVD apparatus shown in FIG. 3. The manufacture steps will be described in detail below.

The source gases were: TMA, TMG, TEB, NH$_3$, and PH$_3$. The substrate temperature was set at 850° to 1,150° C.; the pressure, 0.3 atm; and the total flow rate of the source gases, 1 l/min. The respective gas flow rates were set for a growth rate of 1 μm/h. The flow rates of the respective source gases were: TMA: $1\times10^{-6}$ mol/min; TMG: $1\times10^{-6}$ mol/min; TEB: $1\times10^{-6}$ mol/min; PH$_3$: $5\times10^{-4}$ mol/min; and NH$_3$: $1\times10^{-3}$ mol/min. Si and Mg were respectively used as n- and p-type dopants. Si was doped by mixing silane (SiH$_4$) with a source gas, and Mg was doped by mixing cyclopentadienyl magnesium (CP$_2$Mg) with a source gas.

A 0.1-μm thick p-type BP buffer layer is formed on a Zn-doped p-type GaP substrate. A p-type AlGaN/BP superlattice layer 81 (carrier concentration: $1\times10^{-17}$ atoms/cm$^3$; thickness: 2 μm; band gap: 3.0 eV), an undoped AlGaN/BP superlattice layer 82 (thickness: 0.5 μm; band gap: 2.7 eV), and an n-type AlGaN/BP superlattice layer 83 (carrier concentration: $1\times10^{17}$ atoms/cm$^3$; thickness: 2 μm; band gap: 3.0 eV) are sequentially grown on the buffer layer. Of the stacked portions of this DH structure, a portion having a band gap of 3.9 eV consists of Al$_{0.5}$Ga$_{0.5}$N (13 Å)/BP (7 Å), and an undoped portion having a band gap of 2.7 eV consists of Al0.5Ga0.5N (10 Å)/BP (10 Å). This stacked portion is formed at a stacking cycle of 20 Å. A contact layer 84 (carrier concentration: $5\times10^{17}$ atoms/cm$^3$; band gap: 3.4 eV) consisting of an Si-doped n-type AlGaN is grown on the DH structure to a thickness of 30 μm. This contact layer 84 has a ZB structure near the interface with the n-type AlGaN/BP layer 83. However, if the layer 84 is grown thick, its most part becomes a WZ type. This layer is transparent to emission wavelengths. In addition, this layer has a high growth rate, and hence is suitable for a thick layer such as a contact layer.

Upon formation of the respective semiconductor layers in this manner, the GaP substrate side is polished and etched by using a 2% bromine methyl alcohol solution, thus completely removing the substrate and the BP buffer layer. Finally, In (indium) electrodes 85 and 86 are formed on the upper and lower surfaces of the resultant structure to complete the LED shown in FIG. 18.

According to this embodiment, the thick contact layer is left, and the substrate and the buffer layer are removed so as to prevent a loss due to light absorption. Blue emission of 20 mcd which was about double that of an LED with a substrate was confirmed. An unnecessary stress does not act on the light-emitting portion because of removal of the substrate, and hence reliability is improved.

The same effects as described above can be obtained if a mixed crystal layer having a composition similar to that of the AlGaN/BP superlattice structure is used for the light-emitting layer portion in place of the AlGaN/BP superlattice structure. Similar to the DH structure of the light-emitting layer, the effects obtained by removal of a substrate can be expected from a homojunction structure and a single-heterojunction structure.

FIG. 19 shows a single-heterojunction type LED having contact layers left only at portions near its electrodes according to still another embodiment. This embodiment employs basically the same materials and method as those of the embodiment described with reference to FIG. 18. More specifically, a p-type BP layer (carrier concentration: $2\times10^{17}$ atoms/cm$^3$; thickness: 5 μm) 91 serving both as a buffer layer and a contact layer is formed on a Zn-doped p-type GaP substrate. A p-type AlGaN/BP superlattice layer (carrier concentration: $1\times10^{17}$ atoms/cm$^3$; thickness: 3 μm; stacking cycle: 13 Å/7 Å) 92 as a light-emitting layer portion, and an n-type AlGaN/BP superlattice layer (carrier concentration: $2\times10^{16}$ atoms/cm$^3$; thickness: 3 μm; stacking cycle: 10 Å/10 Å) 93 are sequentially grown on the resultant structure. In addition, an n-type BP layer 94 as a contact layer is grown on the resultant structure to a thickness of 5 μm. Similarly, in this embodiment, each superlattice layer has a composition of Al$_{0.5}$Ga$_{0.5}$N/BP and a stacking cycle of 20 Å.

Upon growth of the crystal, the GaP substrate is removed by etching in the same manner as described in the previous embodiment. In (indium) electrodes 95 and 96 are formed on the upper and lower surfaces of the resultant structure, and the BP layers 91 and 94 are then etched by using the electrodes as etching masks, thus obtaining the structure shown in FIG. 19.

Similarly, in this embodiment, by removing the substrate and the unnecessary contact layers by etching, a high-luminance blue LED having a long service life can be obtained. In this embodiment, a mixed crystal film equivalent to the superlattice layer can be used in place thereof.

FIG. 20 shows an LED having buffer and contact layers whose thicknesses are too small to pose the problem of light absorption according to still another embodiment. A p-type BP buffer layer 101 having a thickness of 0.1 μm and a carrier concentration of $3\times10^{17}$ atoms/cm$^3$ is formed on a Zn-doped p-type GaP substrate. A p-type AlGaN/BP superlattice layer 102 (carrier concentration: $1\times10^{17}$ atoms/cm$^3$; thickness: 2 μm; band gap: 3.0 eV), an undoped AlGaN/BP superlattice layer 103 (thickness: 0.5 μm; band gap: 2.7 eV), and an n-type AlGaN/BP superlattice layer 104 (carrier concentration: $1\times10^{17}$ atoms/cm$^3$; thickness: 2 μm; band gap: 3.0 eV) are sequentially grown on the buffer layer. This DH structure is identical to that of the embodiment described with reference to FIG. 18. An Si-doped n-type BP layer (carrier concentration: $3\times10^{17}$ atoms/cm$^3$) 105 is grown on the DH structure to a thickness of 0.1 μm. After the respective semiconductor layers are formed, mechanical polishing is performed, and the GaP substrate is removed by etching using a 2% bromine methyl alcohol solution. Subsequently, In (indium) electrodes 106 and 107 are formed.

As described in this embodiment, even if contact layers are left, and if they are very thin, light absorption is little. Therefore, high-luminance properties can be obtained.

As described above, one of the problems posed against the compound semiconductor materials of the present invention is that there is no high-quality substrate which allows lattice matching with the materials. As described in the respective embodiments, when a GaP substrate is used, lattice mismatching corresponding to about 15% is present. This causes defects or a large stress to act on a light-emitting layer. Therefore, a problem is posed in terms of reliability. Embodiments in which this problem is solved and highly reliable light-emitting elements are realized will be described below. In the subsequent embodiments, a buffer layer having the same multilayer structure as that of a light-emitting layer is grown as an underlying layer of the light-emitting layer.

FIG. 21 shows a semiconductor laser according to one of the embodiments mentioned above. An n-type GaP layer 112 as a buffer layer is formed on an n-type GaP substrate 111. N-type GaAlN/BP superlattice layers having different average compositions are alternately stacked on the GaP layer 112 to form a buffer layer 113 of a multilayer structure. An n-type GaAlN/BP super-lattice layer 114 as a first clad layer, an undoped GaAlN/BP superlattice layer 115 as an active layer, and a p-type GaAlN/BP superlattice layer 116 as a second clad layer are sequentially formed on the buffer layer 113. An n-type BP layer 117 having a striped opening formed at its central portion and serving as a current limit layer is formed on the double-heterojunction structure formed in this manner. In addition, a p-type BP layer 118 as a contact layer is formed on the resultant structure. P- and n-side metal electrodes 110 and 110 are respectively formed on the p-type BP layer 118 and the substrate.

This semiconductor laser is manufactured by using the MOCVD apparatus of a multi-chamber system shown in FIG. 3 basically under the same conditions of source gases, gas flow rates, doping, and the like as those described in the previous embodiments. A typical stacking cycle of the GaAl/BP superlattice layers is 50 Å. A ratio or the thickness of a nitride to that of a boride is set as 1:1. If this ratio becomes smaller than 1, a band structure is changed from a direct transition type to an indirect transistion type, and the light emission efficiency is degraded. If the stacking cycle exceeds 50 Å, electrons and holes locally exist to decrease a conductivity.

A detailed arrangement of the laser will be described below. The GaP substrate 111 consists of an Si-doped substrate having a carrier concentration of $1 \times 10^{17}$ atoms/cm$^3$; the GaP buffer layer 112, an Si-doped layer having a carrier concentration of $1 \times 10^{17}$ atoms/cm$^3$ and thickness of 1 μm; the buffer layer 113 of a multilayer structure, a layer obtained by alternately growing n-type GaAlN/BP layers and n-type $Ga_{0.4}Al_{0.6}N/BP$ layers (Si doping; carrier concentration: $1 \times 10^{17}$ atoms/cm$^3$) at a stacking cycle of 500 Å to a thickness of 1 μm; the n-type first clad layer 114, a $Ga_{0.4}Al_{0.6}N/BP$ superlattice layer (Si doping; carrier concentration: $1 \times 10^{17}$ atoms/cm$^3$ thickness: 1 μm); the undoped active layer 115, a $Ga_{0.5}Al_{0.5}N/BP$ superlattice layer (thickness: 0.1 μm); and the p-type second clad layer 116, a $Ga_{0.4}Al_{0.6}N/BP$ superlattice layer (Mg doping; carrier concentration $1 \times 10^{17}$ atoms/cm$^3$; thickness; 1 μm). A striped $SiO_2$ film having a width of 5 μm is formed on the p-type clad layer 116 by thermal decomposition and photoetching, and a current blocking layer 117 (Si doping; carrier concentration a $1 \times 10^{17}$ atoms/cm$^3$; 1 μm) consisting of an n-type BP layer is selectively grown. The $SiO_2$ film is then removed, and a p-type BP layer 118 (Mg doping; carrier concentration: $1 \times 10^{17}$ atoms/cm$^3$ thickness: 1 μm) as a contact layer is grown on the resultant structure. Thereafter, an Au/Zn electrode 119 and an Au/Ge electrode 110 are respectively formed on the p and n sides.

The wafer obtained in this manner was split along the cleavage plane to obtain a laser having a resonator length of 300 μm. In a pulse operation of the pulse width of 100 μsec at the liquid nitrogen temperature, green laser emission was recognized. The threshold current density was about 50 KA/cm$^2$. No laser oscillation was recognized at room temperature. However, in the LED mode, stable light emission for 100 or more hours was recognized. This stable operation seemed to be based on reduction in stress acting on the active layer.

FIG. 22 shows still another embodiment as a modification of the semiconductor laser of the embodiment described with reference to FIG. 21. In the embodiment described with reference to FIG. 21, the n-type BP current blocking layer 117 is formed on the p-type clad layer 116 by the selective growth process. However, in this embodiment, the surface of a p-type clad layer 116 is selectively etched in advance to form a striped projection. An n-type BP current blocking layer 117 is then formed around the projection.

Figure 23:
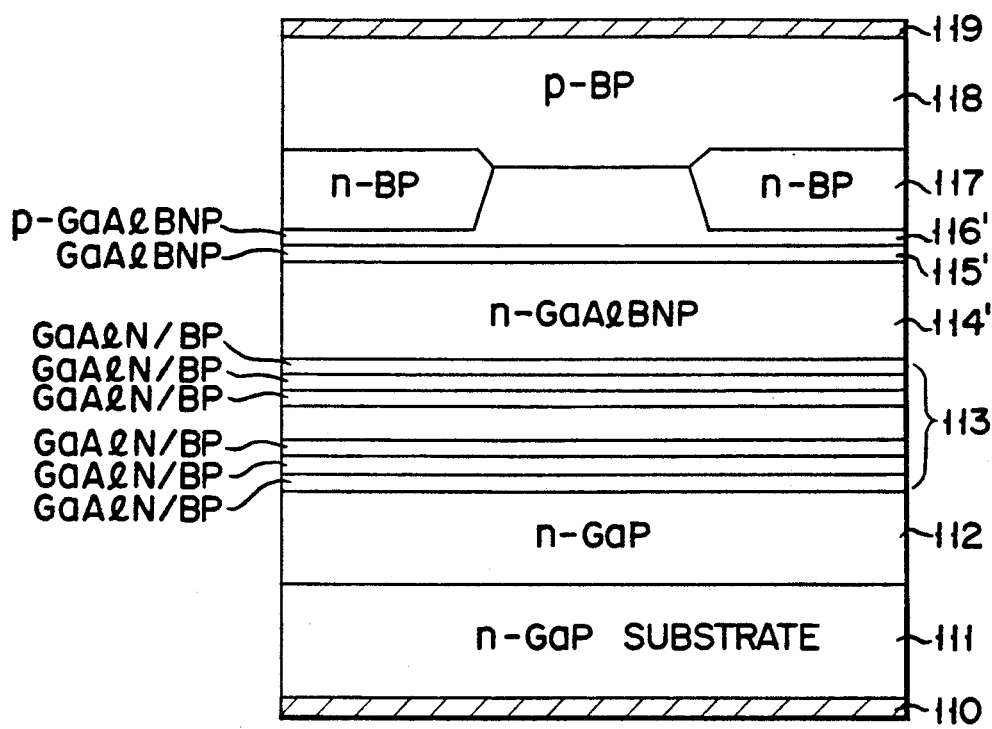

FIG. 23 shows still another embodiment as a modification of the semiconductor laser of the embodiment described with reference to FIG. 22. In the preceding embodiment, each of an n-type clad layer 114, an active layer 115, and the p-type clad layer 116 consists of a GaAlN/BP superlattice layer. In contrast to this, in this embodiment, each of an n-type clad layer 114', an active layer 115', and a p-type clad layer 116' consists of a GaAlBNP mixed crystal layer having a composition equivalent to that of the above superlattice layer.

Similarly, in these embodiments, by forming a buffer layer having a multilayer (superlattice) structure, stable light emission can be realized. A buffer layer having a multilayer structure may be formed by stacking a plurality of $Ga_xAl_yB_{1-x-y}N_zP_{1-z}$ mixed crystal layers having different average compositions. In addition, such a buffer layer may be formed by staking a plurality of GaAlN/BP superlattice layers and $Ga_xAl_yB_{1-x-y}N_zP_{1-z}$ mixed crystal layers having different average compositions. The buffer layers of multilayer structures described above are also effective for LEDs.

In the embodiments described with reference to FIGS. 21 to 23, in order to obtain a DH structure, a composition ratio is changed. However, if a superlattice structure is obtained by changing its film thickness ratio, and a mixed crystal is obtained by changing its mixed crystal ratio, a DH structure can be obtained in the same manner as described above. In the above embodiments, a composition of $Ga_xAl_yG_{1-x-y}N_zP_{1-z}$ wherein $x+y=0.5$ is described. However, other compositions may be employed. With regard to a light-emitting layer, however, if x+y becomes smaller than 0.5, the band structure is changed to an indirect transition type. Therefore, the value x+y should not be smaller than 0.5. Lattice matching between a BP layer and GaAlN can be improved by adding In (indium) in GaAlN or GaAlBNP.

Embodiments in which the problem of lattice mismatching between a light-emitting layer portion constituted by a compound semiconductor layer of the present invention and a substrate is solved by selection of substrate materials will be described below. A compound semiconductor layer containing boron and nitrogen having large band gaps is grown by the MOCVD method. In this case, the growth process is preferably performed at a high substrate temperature. However, since a GaP substrate described in the above embodiments has a melting point of 1,467° C., the growth process cannot be performed at an excessively high temperature so as to prevent damage to the substrate. In contrast to this, in the subsequent embodiments, an SiC substrate having a melting point as high as 2,830° C. and a lattice constant smaller than that of a GaP substrate is used, thereby allowing high-temperature growth. Therefore, lattice matching between a substrate and a light-emitting layer portion can be improved.

Figure 24:
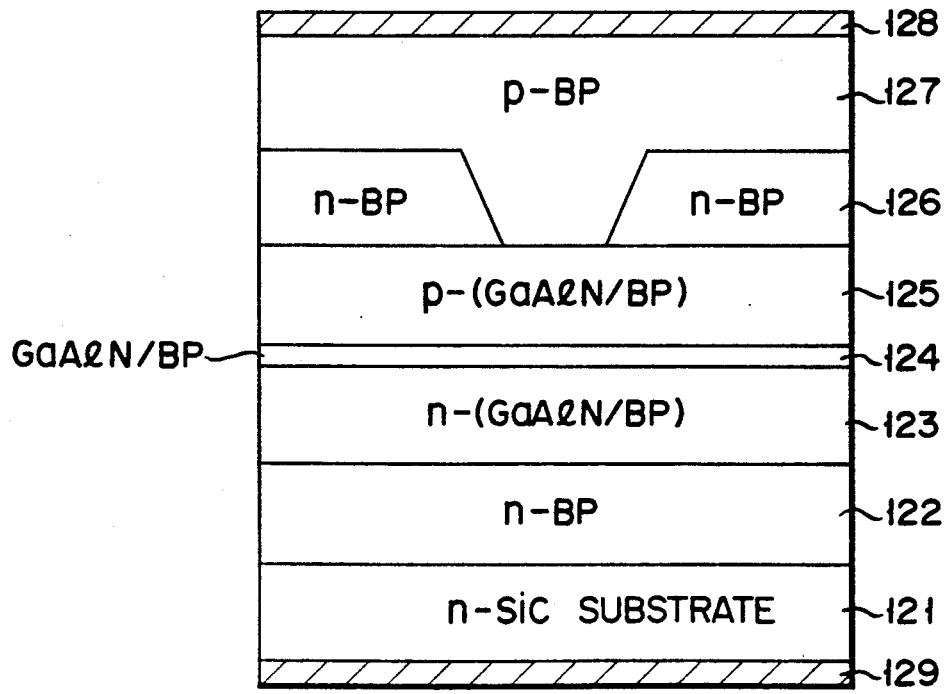
FIGS. 24 to 26 are views each for explaining a laser using a SiC substrate according to an embodiment of the present invention.

FIG. 24 shows a DH structure semiconductor laser according to one of the embodiments mentioned above. An n-type BP layer 122 as a buffer layer is formed on an n-type SiC substrate 121. An first clad layer 123 consisting of n-type GaAlN/BP superlattice layer, an active layer 124 consisting of an undoped GaAlN/BP superlattice layer, and a second clay layer 125 consisting of a p-type GaAlN/BP superlattice layer are sequentially formed on the BP layer 122, thus constituting a DH structure. A current blocking layer 126 consisting of an n-type BP layer is formed on the second clad layer 125 except for a striped portion formed at its central portion. A contact layer 127 consisting of a p-type BP layer is formed on the resultant structure. Ohmic electrodes 128 and 129 are respectively formed on the upper and lower surfaces of the element.

Similar to the above-described embodiments, in this semiconductor laser, the respective semiconductor layers are grown by using the MOCVD apparatus shown in FIG. 3. In the growth process, the growth conditions such as sources gases, gas flow rates, and dopants are the same as those described in the above embodiments. The substrate temperature, however, is set at a high temperature, e.g., 1,200° to 1,400° C. as compared with the case of a GaP substrate.

A detailed arrangement of the laser will be described below. The SiC substrate 121 consists of an Al-doped substrate having a carrier concentration of $1 \times 10^{17}$ atoms/cm$^3$; the BP buffer layer 122, an Si-doped layer having a carrier concentration of $1 \times 10^{17}$ atoms/cm$^3$ and a thickness of 1 μm; the first clad layer 123, an n-type Ga$_{0.4}$Al$_{0.6}$N/BP superlattice layer (Si doping: carrier concentration: $1 \times 10^{17}$ atoms/cm$^3$; 1 μm); the active layer 124, an undoped Ga$_{0.5}$Al$_{0.5}$N/BP superlattice layer (0.1 μm); and the second clad layer 125, a p-type Ga$_{0.4}$Al$_{0.6}$N/BP superlattice layer (Mg doping: carrier concentration: $1 \times 10^{17}$ atoms/cm$^3$; 1 μm). A striped SiO$_2$ film mask is formed on the second clad layer 125, and an n-type BP layer (Si doping; carrier concentration: $1 \times 10^{17}$ atoms/cm$^3$; 1 μm) is selectively grown to form a current blocking layer 126. The mask is then removed, and a contact layer 127 consisting of a p-type BP layer (Mg doping; carrier concentration: $1 \times 10^{17}$ atoms/cm$^3$; 1 μm) is formed. P- and n-side electrodes 128 and 129 are respectively constituted by an Au/Zn film and an Au/Ge film.

The wafer obtained in this manner was split along the cleavage plane to obtain a laser having a resonator length of 300 μm. In a pulse operation of a pulse width of 100 μsec at the liquid nitrogen temperature, green laser emission was recognized. The threshold current density was about 50 kA/cm$^2$. No laser oscillation was recognized at room temperature. However, in the LED mode, stable light emission for 100 hours was recognized.

Figure 25:
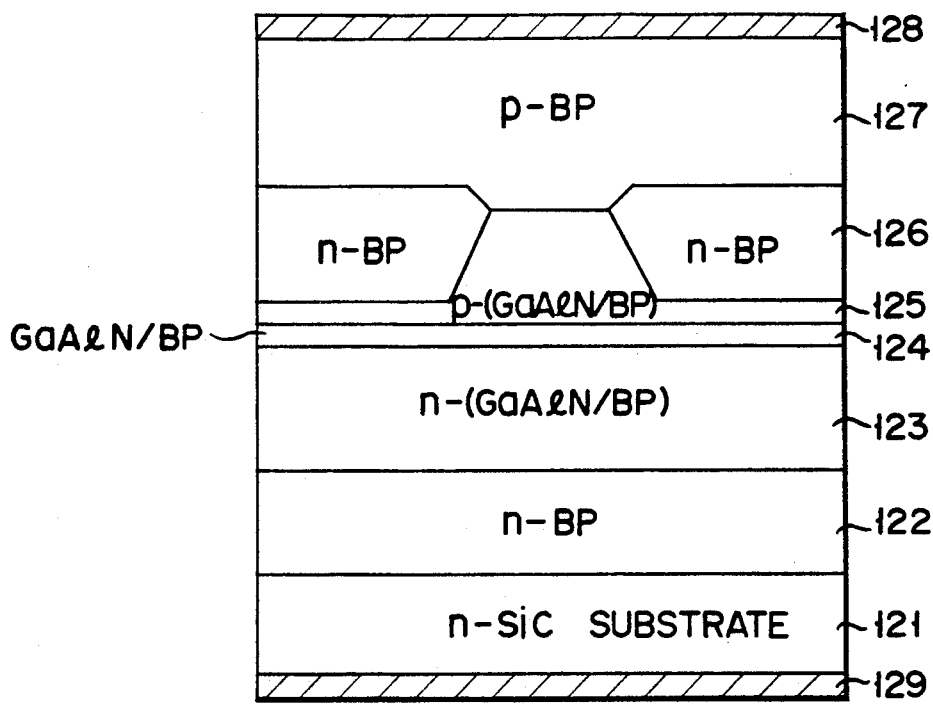

FIG. 25 shows an arrangement of still another embodiment of a modification of the embodiment described with reference to FIG. 24, in which the light-emitting layer portion is modified. In the embodiment described with reference to FIG. 24, the n-type BP current limit layer 126 is selectively grown on the p-type clad layer 125. However, in this embodiment, the upper surface of a p-type clad layer 125 is selectively etched in advance to form a striped projection. An n-type BP current blocking layer 126 is then formed around the projection.

Figure 26:
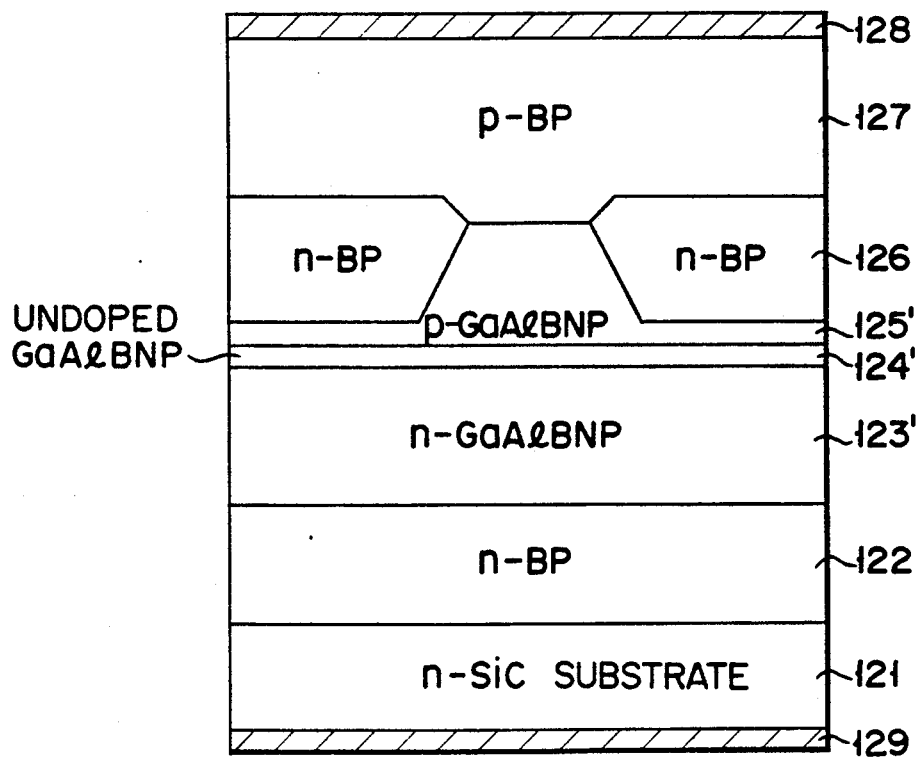

FIG. 26 shows still another embodiment of a modification of the semiconductor laser of the embodiment described with reference to FIG. 24. In the preceding embodiment, each of the n-type clad layer 123, the active layer 124, and the p-type clad layer 125 consists of a GaAlN/BP superlattice layer. In contrast to this, in this embodiment, each of an n-type clad layer 123', an active layer 124', and a p-type clad layer 125' consists of a GaAlBNP mixed crystal layer having the same composition as that of the above-described superlattice layer.

Similarly, in these embodiments, stable light emission can be realized. In addition, lattice matching between a BP layer and a GaAlN layer can be improved by adding In (indium) in GaAlN or GaAlGNP. In the above-described embodiment, an Si substrate can be effectively used for high-temperature growth in place of an SiC substrate. The use of SiC and Si substrates is effective in manufacture of LEDs.

Each compound semiconductor material of the present invention has a low ionization tendency of BP, a ZB structure, and large band gap properties of GaAlN. However, if an acceptor impurity enters in a GaAlN layer portion, N is removed, i.e., a self compensating effect occurs. For this reason, p-type doping at a high concentration is difficult to perform. It is found that in order to solve this problem, selective doping of a p-type impurity in only a BP layer having a low ionization tendency is effective when a GaAlN/BP superlattice layer is formed. If a p-type impurity is doped in the entire GaAlN/BP superlattice layer, in addition to the self compensating effect, a large number of defects are caused, and a high carrier concentration cannot be obtained as a whole. In contrast to this, if a p-type impurity is selectively doped only in the BP layer, the overall structure is free from the influences of the self compensating effect and no defect occurs. As a result, a large number of the doped impurity ions can be effectively activated as a carrier.

Figure 27A:
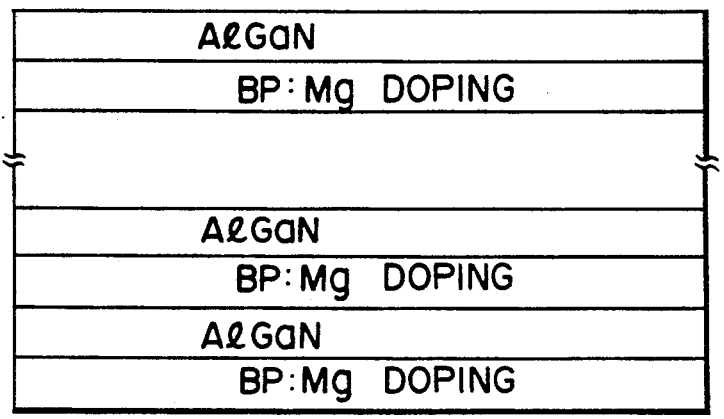
FIG. 27A is a view for explaining selective doping of a p-type impurity into a superlattice layer of the present invention.
Figure 27B:
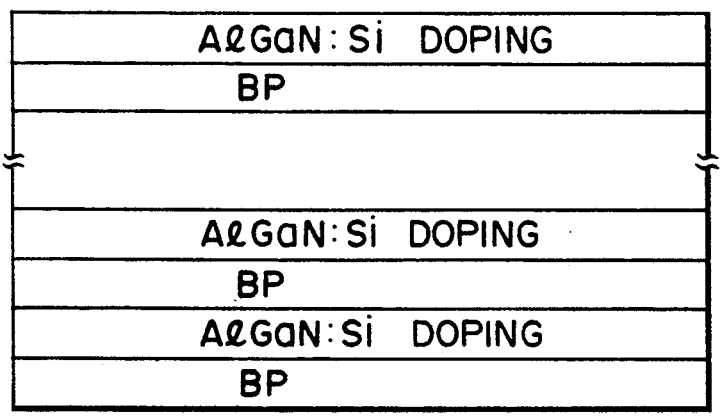
FIG. 27B is a view for explaining selective doping of an n-type impurity into a superlattice layer of the present invention.

FIGS. 27A and 27B illustrate the principle of such a doping method. FIG. 27A shows a case wherein a p-type impurity is doped. FIG. 27B shows a case wherein an n-type impurity is doped. In either case, a multilayer structure is basically used, which is obtained by alternately stacking BP and GaAlN layers at a predetermined stacking cycle. In FIG. 27A, Mg is doped in only BP layers. In FIG. 27B, Si is doped in only GaAlN layers.

Growth of a superlattice layer and selective impurity doping can be performed by the MOCVD apparatus shown in FIG. 3. A GaAlN/BP superlattice layer is formed under the same conditions as those for the formation of each superlattice layer in the above-described embodiments. Si is doped as an n-type impurity in the respective GaAlN layers. Mg is doped as a p-type impurity in the respective BP layers. In doping of an n-type impurity, Si may be simultaneously doped in the GaAlN and BP layers. However, since BP has a very large effective mass, it is not suitable for doping of an n-type impurity. It was confirmed that after this selective doping, both p- and n-type superlattice structure semiconductor films each having a carrier concentration on the order of $10^{18}$ atoms/cm$^3$ could be obtained.

Note that even if Mg is slightly mixed with each GaAlN layer in doping of a p-type impurity, and Si is slightly mixed with each BP layer in doping of an n-type impurity, no problem will be posed.

Embodiments in which the above-described selective doping in multilayer structures is applied to manufacture of practical elements will be described below.

Figure 28:
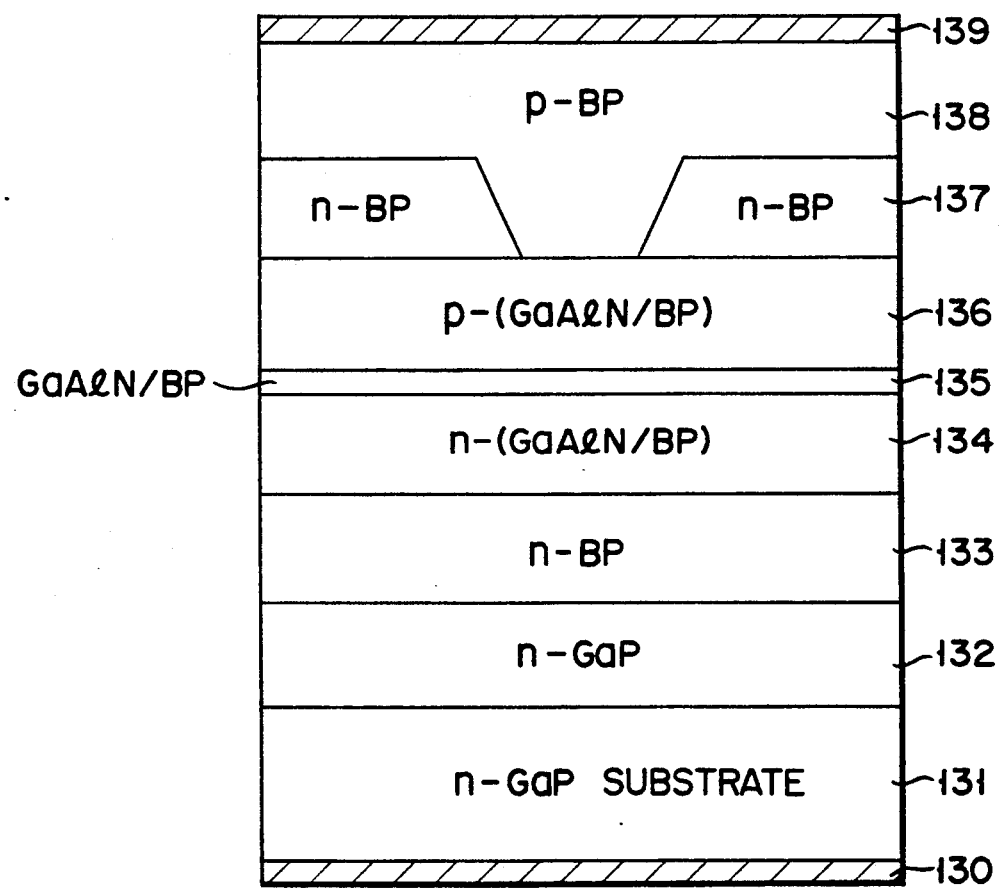

FIG. 28 shows a semiconductor laser of one of the embodiments above mentioned. An n-type GaP buffer layer 132 and an n-type BP buffer layer 133 are sequentially formed on an n-type GaP substrate 131. A first clad layer 134 consisting of an n-type GaAlN/BP superlattice layer, an active layer 135 consisting of an undoped GaAlN/BP superlattice layer, and a second clad layer 136 consisting of a p-type GaAlN/BP superlattice layer are sequentially formed on the buffer layer 133, thus constituting a DH structure. A current blocking layer 137 consisting of an n-type BP layer is formed on the second clad layer 136 except for a striped portion at its central portion. A contact layer 138 consisting of a p-type BP layer is formed on the resultant structure. Ohmic electrodes 139 and 130 are respectively formed on the upper and lower surfaces of the element.

Similar to the preceding embodiments, the respective semiconductor layers of this semiconductor laser are grown by using the MOCVD apparatus shown in FIG. 3. In this growth process, the growth conditions such as source gases, gas flow rates, and dopants are the same as those in the above-described embodiments. However, in doping of a p-type impurity in the GaAlN/BP superlattice layer, Mg is doped only during a growth period of each BP layer. In doping of an n-type impurity in the GaAlN/BP superlattice layer, Si is doped only during a growth period of each GaAlN layer.

A detailed arrangement of the element will be described below. The GaP substrate 131 consists of an Si-doped substrate having a carrier concentration of $1 \times 10^{18}$ atoms/cm$^3$; the n-type Gap buffer layer 132, an Si-doped layer having a carrier concentration of $1 \times 10^{18}$ atoms/cm$^3$ and a thickness of 1 $\mu$m; the n-type BP buffer layer 133, an Si-doped layer having a carrier concentration of $1 \times 10^{18}$ atoms/cm$^3$ and a thickness of 1 $\mu$m; the first clad layer 134, an n-type Ga$_{0.4}$Al$_{0.6}$N/BP superlattice layer (Si doping; carrier concentration: $1 \times 10^{18}$ atoms/cm$^3$; 1 $\mu$m); the active layer 135, an undoped Ga$_{0.5}$Al$_{0.5}$N/BP superlattice lager (0.1 $\mu$m); and the second clad layer 136, a p-type Ga$_{0.4}$Al$_{0.6}$N/BP superlattice layer (Mg doping; carrier concentration: $1 \times 10^{18}$ atoms/cm$^3$; 1 $\mu$m). A striped SiO$_2$ film mask is formed on the second cl ad layer 136, and an n-type BP layer (Si doping; carrier concentration: $1 \times 10^{18}$ atoms/cm$^3$; 1 $\mu$m) is selectively grown to form a current blocking layer 137. Thereafter, the mask is removed, and a contact layer 138 consisting of a p-type BP layer (Mg doping; carrier concentration: $1 \times 10^{18}$ atoms/cm$^3$; 1 $\mu$m) is formed on the resultant structure. A p-side electrode 139 consists of an Au/Zn film; and an n-side electrode 130, an Au/Ge film.

The wafer obtained in this manner was split along the cleavage plane to obtain a laser having a resonator length of 300 $\mu$m. In a pulse operation of a pulse width of 100 $\mu$sec at the liquid nitrogen temperature, green laser emission was recognized. The threshold current density was about 50 kA/cm$^2$. No laser oscillation was recognized at room temperature. However, in the LED mode, stable light emission for 100 hours was recognized.

FIG. 29 shows still another embodiment of a modification of the semiconductor laser of the embodiment described with reference to FIG. 28. Upon formation of the second clad layer 136, the layer 136 is selectively etched to form a striped projection at its central portion, and a current blocking layer 137 consisting of an n-type BP layer is formed around the projection. With this arrangement, the same effects as those of the embodiment described with reference to FIG. 28 can be obtained. The projection of the second clad layer 136 serves as an optical waveguide because of a difference in refractive index between the projection and the current blocking layer 137. As a result, current limiting and optical confinement can be realized in the manner of self matching.

Figure 30:
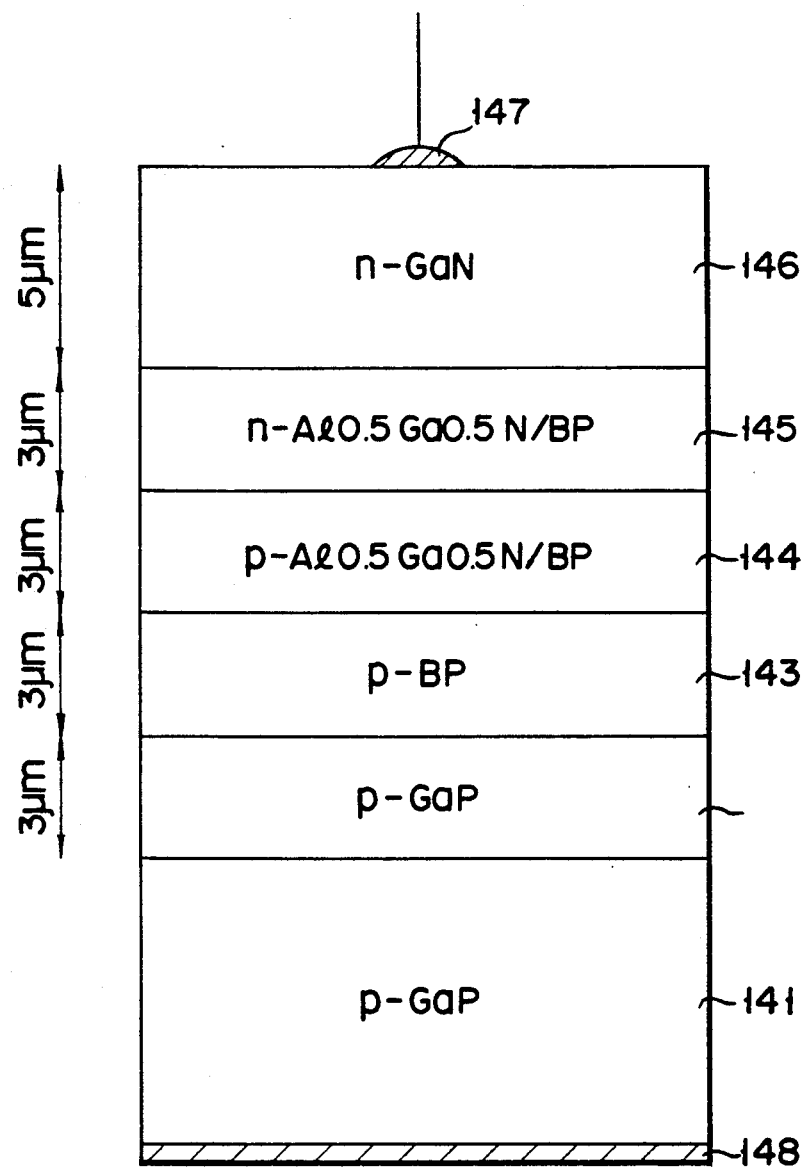
FIGS. 30 and 31 are views for explaining a single-heterojunction type LED to which selective doping in FIGS. 27A and 27B is applied according to an embodiment of the present invention.

FIG. 30 shows an embodiment in which selective doping of impurities in superlattice layers. A p-type GaP buffer layer 142 and a p-type BP buffer layer 143 are sequentially formed on a p-type GaP substrate 141. A p-n junction consisting of a p-type Ga$_{0.5}$Al$_{0.5}$N/BP superlattice layer 144 and an n-type Ga$_{0.5}$Al$_{0.5}$B/BP superlattice layer 145 is formed on the BP buffer layer 143. An n-type GaN contact layer 146 is formed on the resultant structure. Ohmic electrodes 147 and 148 are respectively formed on the upper and lower surfaces of the element.

This LED can be formed by using the MOCVD apparatus shown in FIG. 3 substantially under the same conditions as those in the above-described embodiments.

A detailed arrangement of the element will be described below. The GaP substrate 141 consists of a Zn-doped substrate having a carrier concentration of $2 \times 10^{17}$ atoms/cm$^3$. Each of the p-type GaP buffer layer 142 and the p-type BP buffer layer 143 has a carrier concentration of $2 \times 10^{17}$ atoms/cm$^3$ and a thickness of 3 $\mu$m. The p-type Ga$_{0.5}$Al$_{0.5}$N/BP superlattice layer 144 has a multilayer structure (band gap: 3.0 eV) formed at a stacking cycle of 13 Å/7 Å and having a carrier concentration of $1 \times 10^{17}$ atoms/cm$^3$ and a thickness of 3 $\mu$m. The n-type Ga$_{0.5}$Al$_{0.5}$N/BP superlattice layer 145 has a multilayer structure (band gap: 2.7 eV) formed at a stacking cycle of 10 Å/10 Å and having a carrier concentration of $2 \times 10^{16}$ atoms/cm$^3$ and a thickness of 3 $\mu$m. Most of the n-type GaN contact layer 146 is formed into a WZ structure. The layer 146 is doped with Si and has a carrier concentration of $1 \times 10^{17}$ atoms/cm$^3$ and a thickness of 5 $\mu$m. When the p-type Ga$_{0.5}$Al$_{0.5}$N/BP superlattice layer 144 is formed, Mg doping is performed only during a growth period of each BP layer. When the n-type Ga$_{0.5}$Al$_{0.5}$N/BP superlattice lager 145 is formed, Si doping is performed only during a growth period of each GaAlN layer.

Figure 31:
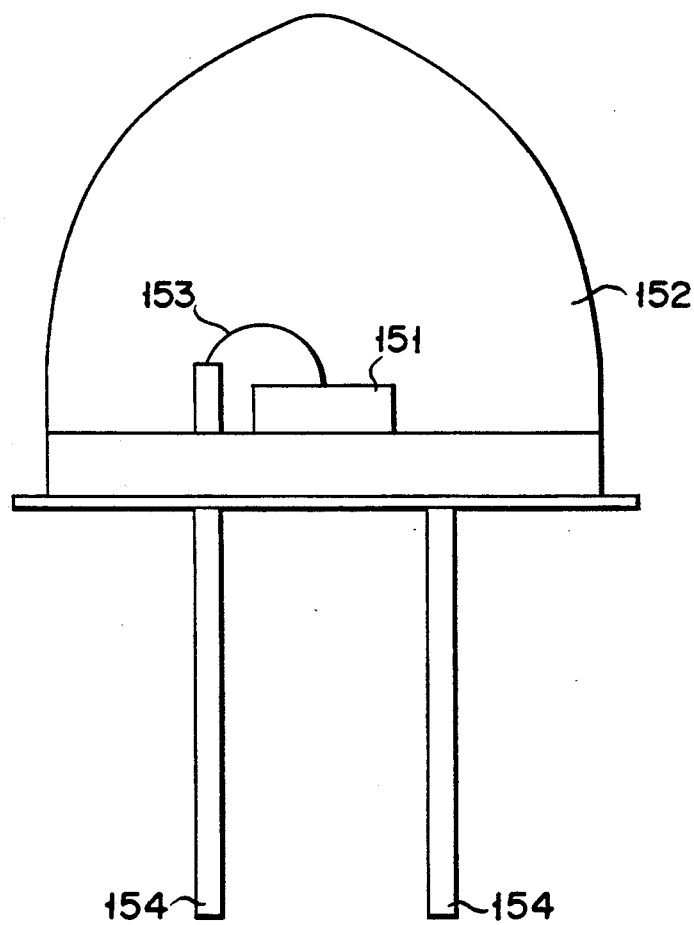

FIG. 31 shows a state wherein an LED chip 151 obtained in this manner is embedded in a resin case 152 serving also as a lens. One terminal of the element is connected to one of external leads 154 through an internal lead 153.

In such a resin encapsulated type LED, blue emission of about 10 mcd was recognized.

Figure 32:
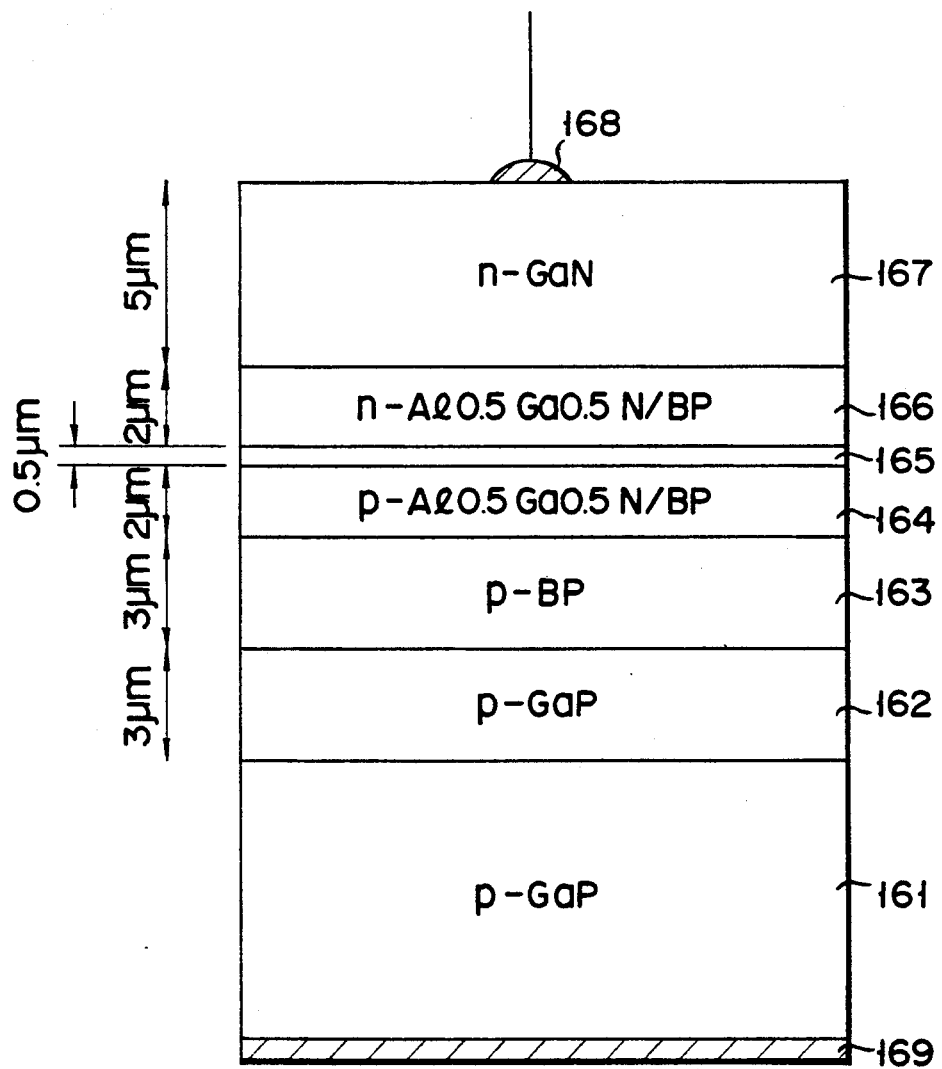
FIG. 32 is a view for explaining a double-heterojunction type LED to which selective doping in FIGS. 27A and 27B is applied.

FIG. 32 shows an embodiment in which the selective doping method for superlattice layers is applied to an LED having a DH structure. A p-type GaP buffer layer 162 and a p-type BP buffer layer 163 are sequentially formed on a p-type GaP substrate 161. A p-type $Ga_{0.5}Al_{0.5}N$/BP superlattice layer 164, an undoped $Ga_{0.5}Al_{0.5}N$/BP layer 165, and an n-type $Ga_{0.5}Al_{0.5}N$/BP layer 166 are sequentially stacked on the buffer layer 163. An n-type contact layer 167 is formed on the resultant structure. Ohmic electrodes 168 and 169 are formed on the upper and lower surfaces of the element wafer.

This LED can also be formed by the MOCVD apparatus shown in FIG. 3 substantially under the same conditions as those in the above-described embodiments.

A detailed arrangement of the element will be described below. The GaP substrate 161 consists of a Zn-doped substrate having a carrier concentration of $2 \times 10^{17}$ atoms/cm$^3$. Each of the p-type GaP buffer layer 162 and the p-type BP buffer layer 163 has a carrier concentration of $2 \times 10^{17}$ atoms/cm$^3$ and a thickness of 3 μm. The p-type $Ga_{0.5}Al_{0.5}N$/BP superlattice layer 164 has a multilayer structure formed at a stacking cycle of 13 Å/7 Å and having a carrier concentration of $1 \times 10^{17}$ atoms/cm$^3$ and a thickness of 2 μm. The undoped $Ga_{0.5}Al_{0.5}N$/BP superlattice layer 165 has a multilayer structure formed at a stacking cycle of 10 Å/10 Å and having a carrier concentration of $2 \times 10^{16}$ atoms/cm$^3$ and a thickness of 0.5 μm. The n-type $Ga_{0.5}Al_{0.5}N$/BP superlattice layer 166 has a multilayer structure formed at a stacking cycle of 13 Å/7 Å and having a carrier concentration of $2 \times 10^{16}$ atoms/cm$^3$ and a thickness of 2 μm. Most of the n-type GaN contact layer 167 is formed into a WZ structure. The layer 167 is doped with Si and has a carrier concentration of $1 \times 10^{17}$ atoms/cm$^3$ and a thickness of 5 μm. When the p-type $Ga_{0.5}Al_{0.5}N$/BP superlattice layer 164 is formed, Mg doping is performed only during a growth period of each BP layer. When the n-type $Ga_{0.5}Al_{0.5}N$/BP superlattice layer 166 is formed, Si doping is performed only during a growth period of each GaAlN layer.

As shown in FIG. 31, such a DH structure LED was resin-encapsulated, and blue emission of higher luminance was recognized.

As described in the embodiments with reference to FIGS. 13, 18, 30 and 32, element formation does not always require a low-resistance p-n junction but sometimes require only a large band gap. Therefore, if ZB type materials which allow easy formation of a low-resistance p-n junction is combined with WZ type materials which can increase a growth rate and allows easy growth of layers under a wide range of growth conditions, the degree of freedom of element design and the margin of manufacture can be increased. As a result, the performance of an element and the manufacturing yield can greatly be increased.

A ZB layer is grown in a relatively narrow range of growth conditions. Especially if the grow rate of a layer having a composition of a large band gap is increased, most of the resultant layer acquires a WZ type structure. In this case, a low-resistance p-type layer cannot be realized. However, large band gaps of GaN and AlN of a direct transition type and low ionization tendency and stability of BP can be utilized. That is, p-n junctions and heterojunctions can be formed in the same manner as in the case wherein ZB type materials are used except that a p-type layer has a relatively high resistance. Therefore, if formation of a thick layer is required while a p-type layer need not have a high carrier concentration, it is advantageous to form a whole element by using WZ type materials in terms of each manufacture.

As has been described above, according to the present invention, by forming a heterojunction or a mixed crystal of BP and $Ga_xAl_{1-x}N$, a compound semiconductor material which has a large band gap, allows easy p-n junction control, and is excellent in crystallinity can be obtained. A short wavelength light-emitting diode or laser, which has not been available, can be obtained by using this material.

What is claimed is:

1. A compound semiconductor material comprising a $Ga_xAl_{1-x}N$ (wherein $0 \leq x \leq 1$) containing B and P and having a zinc blend type crystal structure.

2. A compound semiconductor element comprising $Ga_xAl_{1-x}N$ layers (wherein $0 \leq x \leq 1$) which constitute a p-n junction and have zinc blend type crystal structures.

3. A compound semiconductor element comprising a heterojunction consisting of BP layer and $Ga_xAl_{1-x}N$ (wherein $0 \leq x \leq 1$) layer, said $Ga_xAl_{1-x}N$ (wherein $0 \leq x \leq 1$) layer having a zinc blend type crystal structure.

4. A compound semiconductor element comprising a superlattice layer consisting of BP layer and $Ga_xAl_{1-x}N$ (wherein $0 \leq x \leq 1$) layers, said $Ga_xAl_{1-x}N$ (wherein $0 \leq x \leq 1$) layer having a zinc blend type crystal structure.

5. A compound semiconductor element comprising a $Ga_xAl_yB_{1-x-y}N_zP_{1-z}$ (wherein $0 \leq x, y, z \leq 1$) mixed crystal layer having a zinc blend type crystal structure.

6. An element according to claim 5, wherein said element satisfies $x+y \simeq z$.

7. A compound semiconductor element comprising a superlattice layer or mixed crystal layer consisting of $Ga_aAl_{1-a}N$ and BP whose average composition formula is represented by $Ga_xAl_yB_{1-x-y}N_zP_{1-z}$ and whose composition satisfies $x+y \simeq z$ and $z \leq 0.8$, said layer having a zinc blend type crystal structure.

8. An element according to claim 7, wherein said superlattice layer or mixed crystal layer is formed on a substrate through a buffer layer consisting of a BP layer or a multilayer structure obtained by alternately stacking superlattice layers consisting of $Ga_aAl_{1-a}N$ and BP whose average composition is changed and $Ga_xAl_yB_{1-x-y}N_zP_{1-z}$.

9. An element according to any one of claims 4, 5, or 7, wherein said superlattice layer or mixed crystal layer is formed on a Gap, SiC, or Si substrate.

10. A compound semiconductor element with at least one layer comprising $Ga_xAl_{1-x}N$ (wherein $0 \leq x \leq 1$) containing B and P, wherein the crystal structure of each of said layers comprising said $Ga_xAl_{1-x}N$ is zinc blend type or Worzeite type.

11. A compound semiconductor element comprising $Ga_xAl_{1-x}N$ (wherein $0 \leq x \leq 1$) containing B and P and having a Worzeite type crystal structure.

12. A compound semiconductor element comprising a $Ga_xAl_{1-x}N$ layer wherein $0 \leq x \leq 1$) containing B and P and having a zinc blend type and having a Worzeite type crystal structure.

* * * * *